(12) United States Patent
Kawashima et al.

(10) Patent No.: US 10,797,470 B2
(45) Date of Patent: Oct. 6, 2020

(54) LIGHT EMITTING DEVICE AND METHOD OF MANUFACTURING LIGHT EMITTING DEVICE

(71) Applicants: Takeshi Kawashima, Miyagi (JP); Shunichi Sato, Miyagi (JP)

(72) Inventors: Takeshi Kawashima, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/504,758

(22) Filed: Jul. 8, 2019

(65) Prior Publication Data

US 2020/0044416 A1 Feb. 6, 2020

(30) Foreign Application Priority Data

Aug. 2, 2018 (JP) .................................. 2018-146139

(51) Int. Cl.
| | | |
|---|---|---|
| *H01S 5/00* | (2006.01) | |
| *H01S 5/30* | (2006.01) | |
| *H01S 5/343* | (2006.01) | |
| *H01S 5/323* | (2006.01) | |

(52) U.S. Cl.
CPC .......... *H01S 5/3095* (2013.01); *H01S 5/3054* (2013.01); *H01S 5/3063* (2013.01); *H01S 5/34333* (2013.01); *H01S 5/3013* (2013.01); *H01S 5/32341* (2013.01); *H01S 5/343* (2013.01)

(58) Field of Classification Search
CPC .. H01S 5/3095; H01S 5/3063; H01S 5/34333; H01S 5/343; H01S 5/3054; H01S 5/3013; H01S 5/32341
See application file for complete search history.

(56) References Cited

U.S. PATENT DOCUMENTS

| | | | | |
|---|---|---|---|---|
| 7,501,294 | B1* | 3/2009 | Nakagawa | B82Y 20/00 438/22 |
| 2003/0123505 | A1* | 7/2003 | Peters | H01S 5/18341 372/46.015 |
| 2009/0090900 | A1* | 4/2009 | Avramescu | B82Y 20/00 257/13 |
| 2009/0196317 | A1* | 8/2009 | Suzuki | H01S 5/18308 372/44.01 |
| 2010/0020835 | A1* | 1/2010 | Anan | H01S 5/18308 372/45.01 |
| 2010/0207100 | A1* | 8/2010 | Strassburg | H01L 33/32 257/15 |
| 2011/0012088 | A1* | 1/2011 | Strassburg | H01L 33/04 257/13 |

FOREIGN PATENT DOCUMENTS

| | | |
|---|---|---|
| JP | 2017-092158 | 5/2017 |
| WO | WO2007/012327 A1 | 2/2007 |

* cited by examiner

*Primary Examiner* — Kinam Park
(74) *Attorney, Agent, or Firm* — IPUSA, PLLC

(57) ABSTRACT

A light emitting device includes: a first n-type semiconductor layer disposed on a substrate; a tunnel junction layer disposed on a part of the first n-type semiconductor layer; a p-type semiconductor layer disposed on the first n-type semiconductor layer and covering the tunnel junction layer; an active layer disposed on the p-type semiconductor layer; and a second n-type semiconductor layer disposed on the active layer.

10 Claims, 30 Drawing Sheets

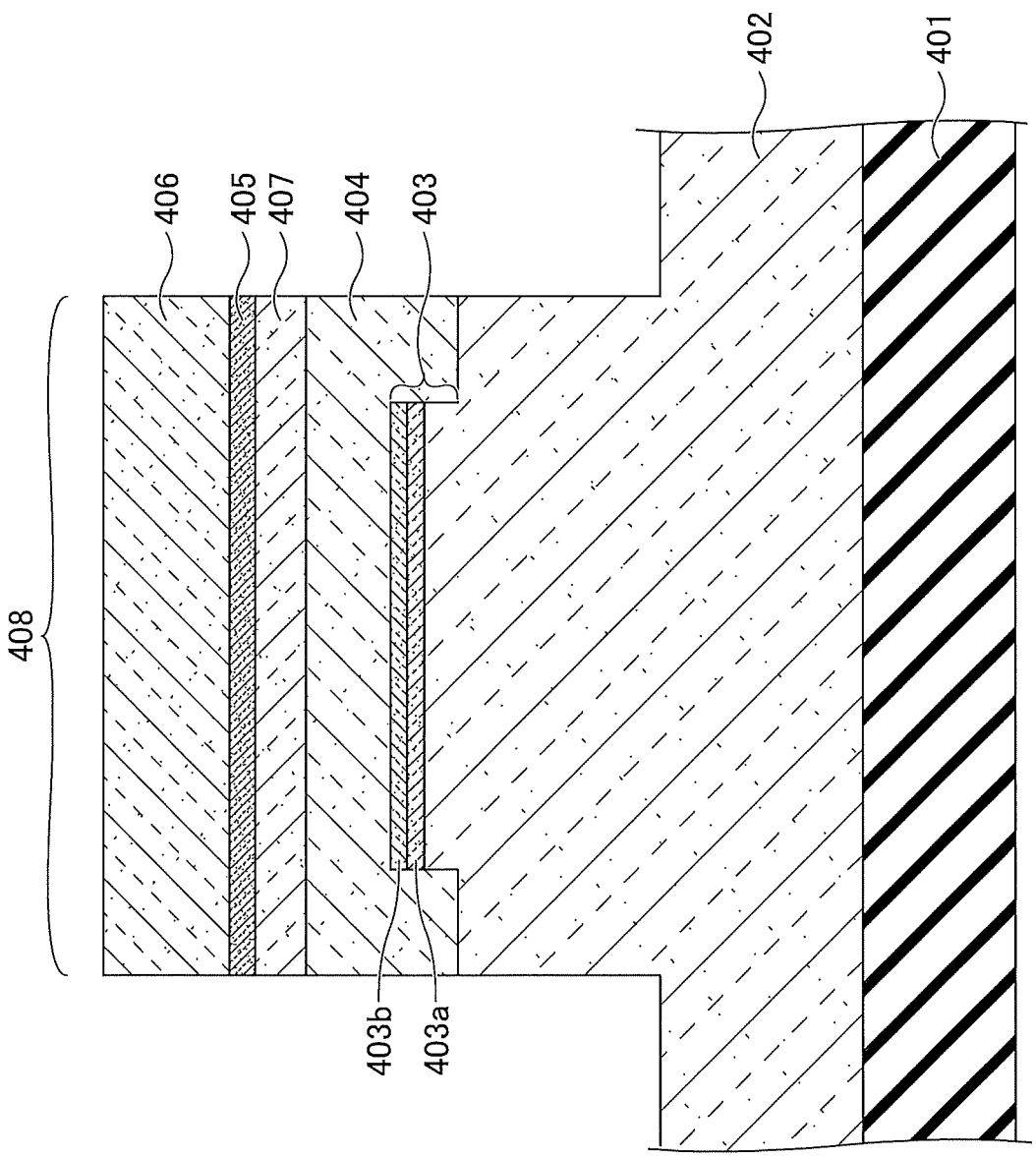

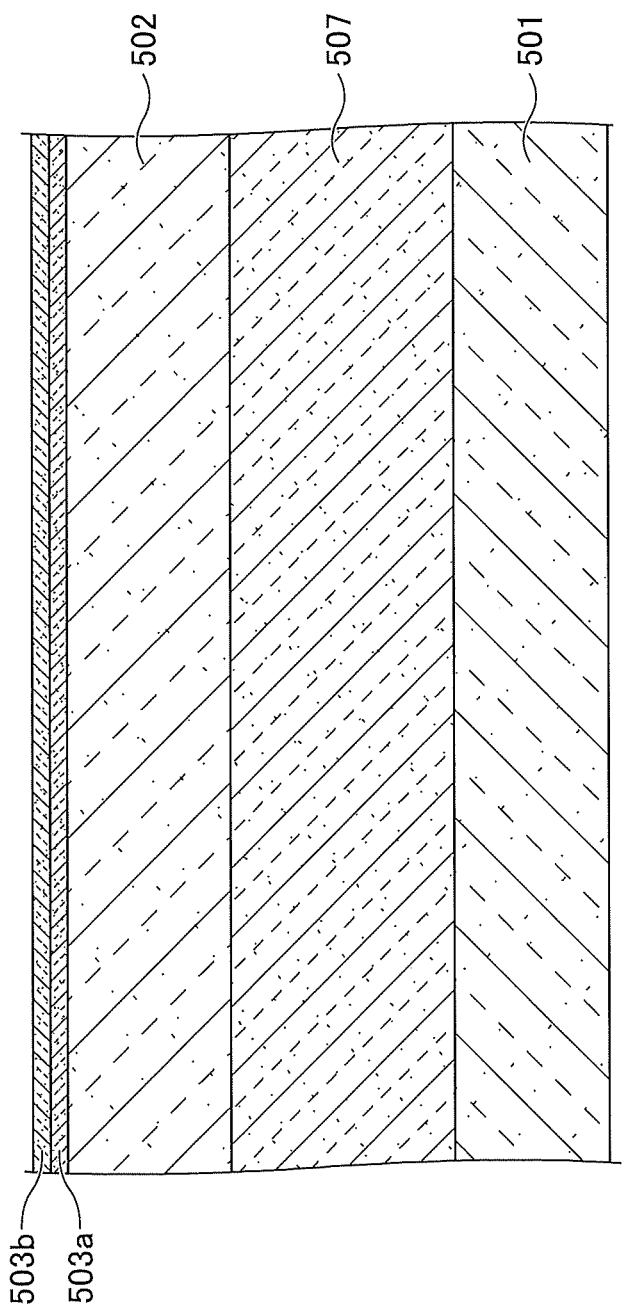

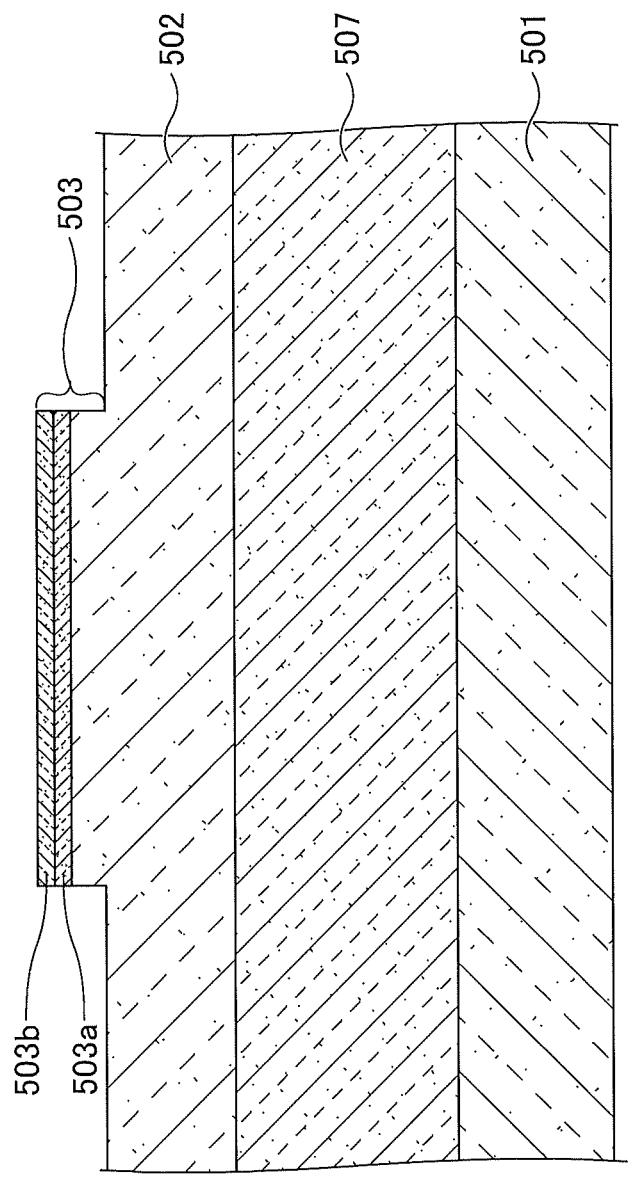

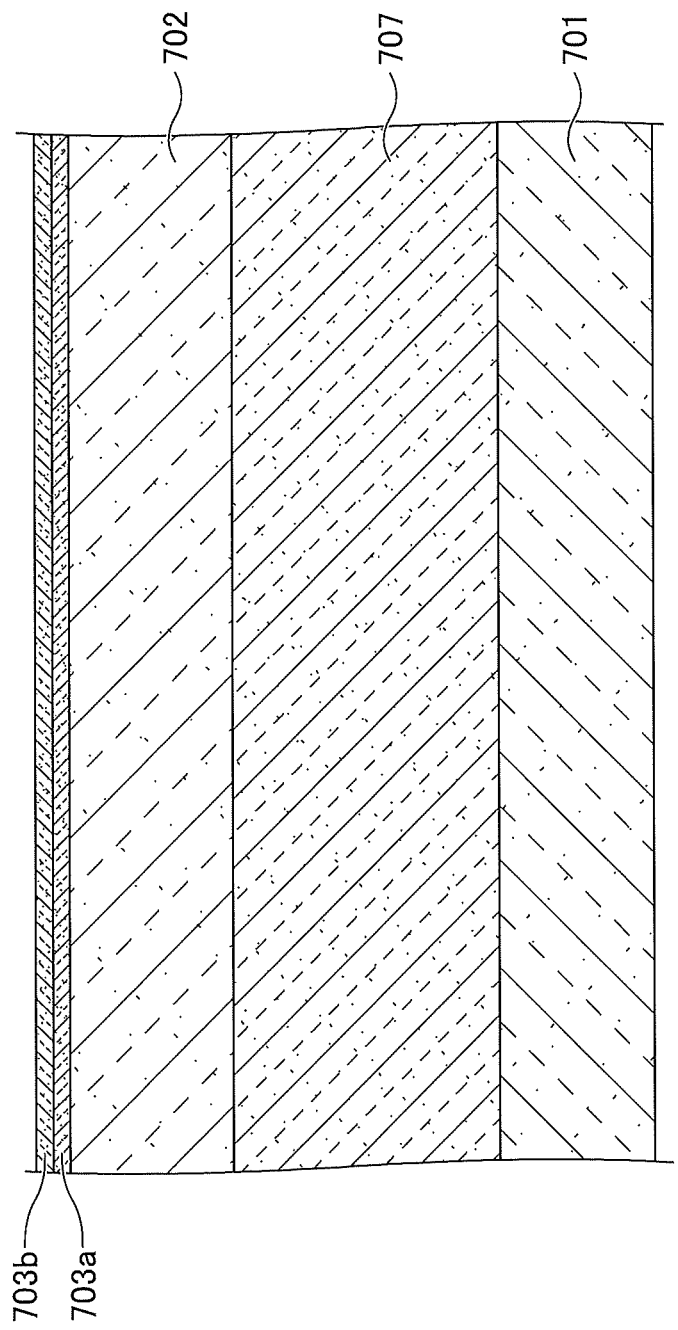

LIGHT EMITTING DEVICE AND METHOD OF MANUFACTURING LIGHT EMITTING DEVICE

CROSS-REFERENCE TO RELATED APPLICATIONS

This patent application is based on and claims priority pursuant to 35 U.S.C. § 119(a) to Japanese Patent Application No. 2018-146139, filed on Aug. 2, 2018, in the Japan Patent Office, the entire disclosure of which is incorporated by reference herein.

BACKGROUND

Technical Field

Embodiments of the present disclosure relate to a light emitting device and a method of manufacturing a light emitting device.

Description of the Related Art

In edge emitting lasers and surface emitting lasers, in order to efficiently amplify light, a current is drawn in a narrow area to cause a population inversion, and the light is confined there and amplified. For example, there is a structure in which a ridge is formed in a p-type semiconductor layer on a wafer surface side, and a structure in which an n-type semiconductor layer having a low refractive index is embedded in a p-type semiconductor layer in an area in which no current flows. Regarding GaAs-based materials, there is an oxide-confined structure with oxidized Al(Ga)As.

A structure for confining a current to a narrow area is called a current-confined structure, which is typically formed in a p-type semiconductor layer. Since a p-type semiconductor layer is higher in electrical resistance than an n-type semiconductor layer, by forming a current-confined structure in the p-type semiconductor layer, it is possible to reduce carrier scattering in an in-plane direction of a substrate before the carriers are injected from the current-confined structure into an active layer. However, magnitude of a resistance in the p-type semiconductor layer may significantly affect characteristics of a light emitting device, which tendency is particularly clear in light emitting devices using nitride semiconductors. For example, an electrical resistance of p-GaN is two to three orders of magnitude higher than an electrical resistance of n-GaN, which significantly affects the characteristics of the light emitting device.

BRIEF SUMMARY

In one aspect, a light emitting device includes: a first n-type semiconductor layer disposed on a substrate; a tunnel junction layer disposed on a part of the first n-type semiconductor layer; a p-type semiconductor layer disposed on the first n-type semiconductor layer and covering the tunnel junction layer; an active layer disposed on the p-type semiconductor layer; and a second n-type semiconductor layer disposed on the active layer.

BRIEF DESCRIPTION OF THE DRAWINGS

The aforementioned and other aspects, features, and advantages of the present disclosure would be better understood by reference to the following detailed description when considered in connection with the accompanying drawings, wherein:

FIG. 9D is a fourth cross-sectional view illustrating the method of manufacturing the light emitting device according to the fourth embodiment;

FIG. 11A is a first cross-sectional view illustrating a method of manufacturing the light emitting device according to the fifth embodiment;

FIG. 11B is a second cross-sectional view illustrating the method of manufacturing the light emitting device according to the fifth embodiment;

FIG. 15A is a first cross-sectional view illustrating a method of manufacturing the light emitting device according to the seventh embodiment;

Figure 1:
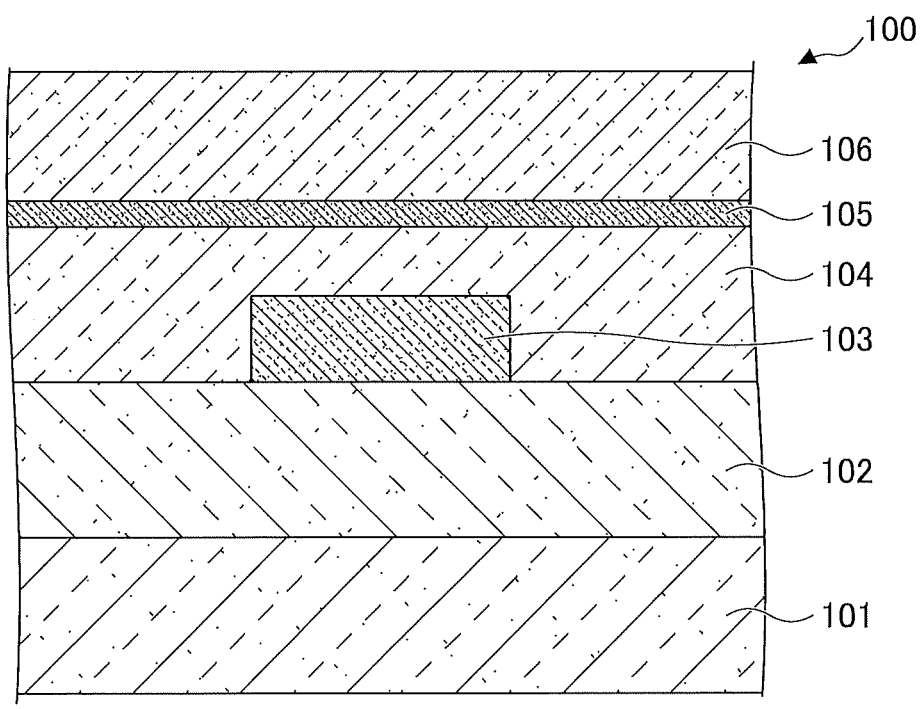
FIG. 1 is a cross-sectional view illustrating a light emitting device according to a first embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION OF EMBODIMENTS

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Below, embodiments of the present disclosure are described in detail with reference to the attached drawings. In the specification and the drawings, components having substantially the same functional configuration are denoted by the same reference numerals and redundant description is omitted. In the present disclosure, in description of positional relationships between the components, a direction away from a substrate may be referred to as an upward direction with reference to the substrate. For example, a film formed in contact with a lower surface of the substrate may be referred to as a film formed on a lower surface of the substrate.

First Embodiment

A first embodiment is described. The first embodiment relates to a light emitting device in which a nitride semiconductor is used. FIG. 1 is a cross-sectional view illustrating a light emitting device according to the first embodiment.

A light emitting device 100 according to the first embodiment includes: a first n-type semiconductor layer 102 formed on a substrate 101; a projecting portion 103 formed on a part of the first n-type semiconductor layer 102; a p-type semiconductor layer 104 formed on the first n-type semiconductor layer 102 and covering the projecting portion 103; an active layer 105 formed on the p-type semiconductor layer 104; and a second n-type semiconductor layer 106 formed on the active layer 105. The projecting portion 103 includes a tunnel junction layer. For example, a nitride semiconductor is used for the first n-type semiconductor layer 102, the projecting portion 103, the p-type semiconductor layer 104, the active layer 105, and the second n-type semiconductor layer 106.

The substrate 101 is made of a material capable of growing a nitride semiconductor layer. The substrate 101 may be, for example, a GaN substrate or a GaN template obtained by growing GaN on a foreign substrate. The foreign substrate may be made of, for example, sapphire, Si, GaAs, and SiC.

The first n-type semiconductor layer 102 contains, for example, Si or Ge as an n-type impurity. The projecting portion 103 is provided on the first n-type semiconductor layer 102 in an area in which a current flows. The p-type semiconductor layer 104 contains, for example, Mg as a p-type impurity. The projecting portion 103 includes a tunnel junction layer and can make a current flow from the first n-type semiconductor layer 102 to the p-type semiconductor layer 104. No current flows in an area in which no projecting portion is provided because the first n-type semiconductor layer 102 and the p-type semiconductor layer 104 are in contact with each other to form a pn junction in which a depletion layer is thick.

In the active layer 105, for example, InGaN/GaN or InGaN/InGaN multi-quantum wells are used to confine carriers injected from the p-type semiconductor layer 104 and the second n-type semiconductor layer 106 and to obtain high luminous efficiency. Mg used as a p-type impurity is particularly easily diffused in a laminating direction (a direction away from the substrate). Therefore, Mg in the p-type semiconductor layer 104 may be mixed into the active layer 105. If Mg is mixed into the active layer 105, light emission efficiency is lowered. Therefore, it is desirable to suppress the diffusion of Mg. Therefore, in order to suppress the diffusion of Mg, it is desirable that a layer containing In, such as InGaN, AlInN, and AlGaInN, is desirably provided between the p-type semiconductor layer 104 and the active layer 105. Among these, a layer containing InGaN is desirably provided.

The tunnel junction layer included in the projecting portion 103 is formed by two semiconductor layers doped with at least a high-concentration impurity. For example, a high-concentration n-type semiconductor layer doped with Si, Ge or the like in an amount of about $10^{20}$ cm$^{-3}$ is provided on the substrate 101 side, and a high-concentration p-type semiconductor layer doped with Mg or the like in an amount of about $10^{20}$ cm$^{-3}$ is provided on the active layer 105 side.

Figure 2A:
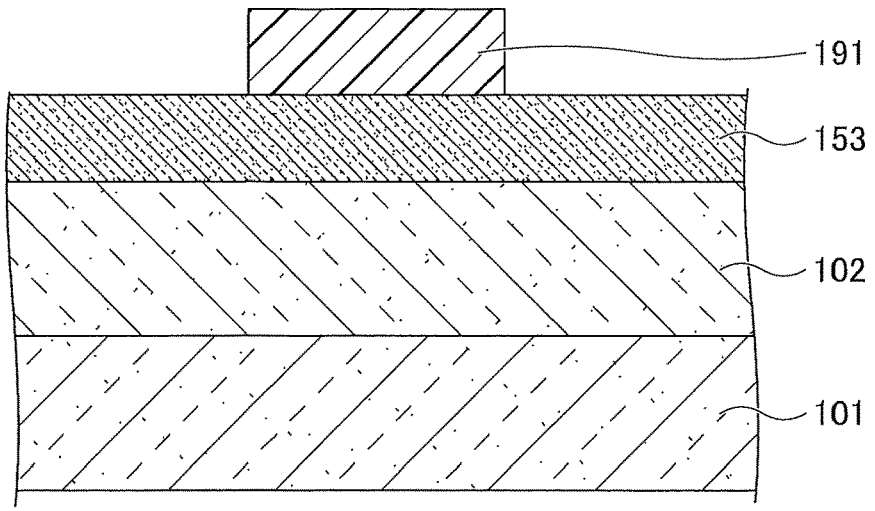
FIG. 2A is a first cross-sectional view illustrating a first exemplary method of manufacturing the light emitting device according to the first embodiment.
Figure 2B:
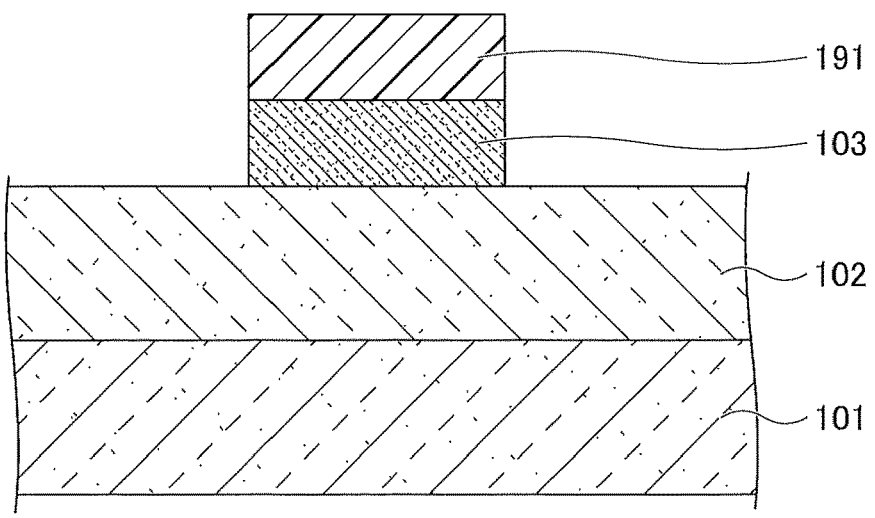
FIG. 2B is a second cross-sectional view illustrating the first exemplary method of manufacturing the light emitting device according to the first embodiment.

Next, a first exemplary method of manufacturing the light emitting device 100 according to the first embodiment is described. FIGS. 2A and 2B are cross-sectional views illustrating the first exemplary method of manufacturing the light emitting device 100 according to the first embodiment.

First, as illustrated in FIG. 2A, a laminated structure 153 from which the first n-type semiconductor layer 102 and the projecting portion 103 are to be produced is formed on the substrate 101. The laminated structure 153 includes a tunnel junction layer. The first n-type semiconductor layer 102 and the laminated structure 153 may be formed, for example, by metal organic chemical vapor deposition (MOCVD), molecular beam epitaxy (MBE), hydride vapor phase epitaxy (HYPE), or sputtering. Next, as also illustrated in FIG. 2A, a dry etching mask 191 is formed on the laminated structure 153 to cover a current-flowing area of the light emitting device 100, that is, an area in which the projecting portion 103 is to be formed.

Then, as illustrated in FIG. 2B, the projecting portion 103 is formed by dry-etching the laminated structure 153 by using the dry etching mask 191.

Subsequently, the dry etching mask 191 is removed. Next, the p-type semiconductor layer 104, the active layer 105, and the second n-type semiconductor layer 106 are formed on the first n-type semiconductor layer 102 (see FIG. 1). The p-type semiconductor layer 104, the active layer 105, and the second n-type semiconductor layer 106 may be formed by, for example, MOCVD, MBE, HYPE, or sputtering.

In this manner, the light emitting device 100 according to the first embodiment is manufactured.

Figure 3A:
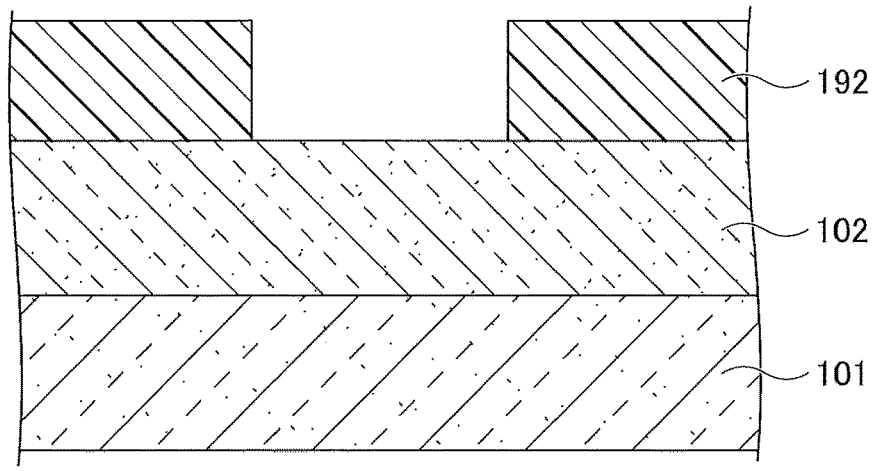
FIG. 3A is a first cross-sectional view illustrating a second exemplary method of manufacturing the light emitting device according to the first embodiment.
Figure 3B:
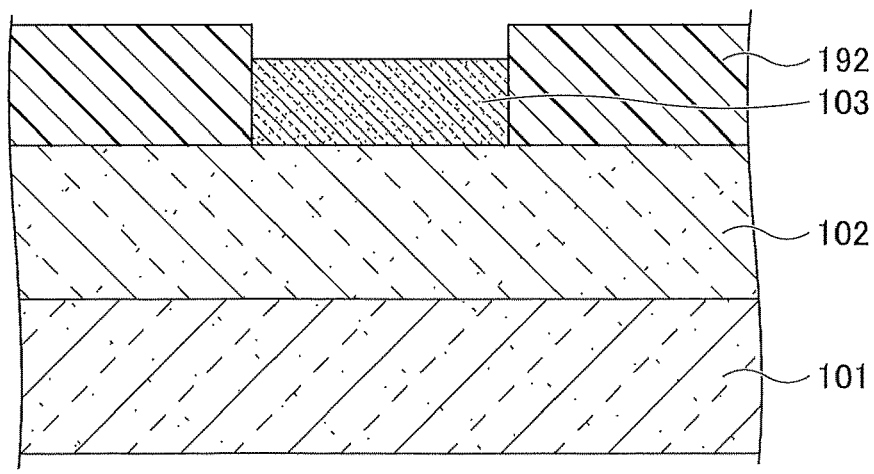
FIG. 3B is a second cross-sectional view illustrating the second exemplary method of manufacturing the light emitting device according to the first embodiment.

Next, a second exemplary method of manufacturing the light emitting device 100 according to the first embodiment is described. FIGS. 3A and 3B are cross-sectional views illustrating the second exemplary method of manufacturing the light emitting device 100 according to the first embodiment.

First, as illustrated in FIG. 3A, the first n-type semiconductor layer 102 is formed on the substrate 101. The first n-type semiconductor layer 102 may be formed by, for example, MOCVD, MBE, HVPE, or sputtering. Next, as also illustrated in FIG. 3A, a growth inhibition mask 192 is formed on the first n-type semiconductor layer 102 to cover an area of the light emitting device 100 in which the current does not flow, that is, an area excluding an area in which the projecting portion 103 is to be formed. The growth inhibition mask 192 exposes an area of the light emitting device 100 in which the current flows, that is, an area in which the projecting portion 103 is to be formed.

Then, as illustrated in FIG. 3B, the projecting portion 103 is formed on the first n-type semiconductor layer 102 by using the growth inhibition mask 192. The projecting portion 103 may be formed by, for example, MOCVD, MBE, HYPE, or sputtering.

Subsequently, the growth inhibition mask 192 is removed. Next, the p-type semiconductor layer 104, the active layer 105, and the second n-type semiconductor layer 106 are formed on the first n-type semiconductor layer 102 (see FIG. 1). The p-type semiconductor layer 104, the active layer 105, and the second n-type semiconductor layer 106 may be formed by, for example, MOCVD, MBE, HYPE, or sputtering.

In this manner, the light emitting device 100 according to the first embodiment is manufactured.

In the light emitting device 100, the p-type semiconductor layer 104 that covers the projecting portion 103 including the tunnel junction layer is formed on the first n-type semiconductor layer 102, and the active layer 105 is formed on the p-type semiconductor layer 104. That is, in the present embodiment, the active layer 105 may be formed after the projecting portion 103 including the tunnel junction layer is formed. If etching for forming the tunnel junction layer is performed after the active layer is formed as in the case of a method according to a comparative example, the active layer may be damaged. Such damage may increase a leakage current. However, according to the present embodiment, such damage and a leakage current can be reduced.

According to a comparative example, in order to reduce the leakage current due to damage to the active layer caused by dry-etching, a thickness of a p-GaN layer from a surface of the p-GaN layer to the active layer in an area in which no current flows is set to be 130 nm or greater. By contrast, since the occurrence of such damage and the leakage current can be reduced in the present embodiment, a thickness of the p-type semiconductor layer 104 between the tunnel junction layer and the active layer 105 can be reduced. Therefore, an electric resistance of the light emitting device 100 can be reduced.

Compared with a light emitting device according to a comparative example in which a lower n-type semiconductor layer, an active layer, and a p-type semiconductor layer are formed in this order on a substrate, the p-type semiconductor layer 104 can be formed at a high temperature. Therefore, a favorable active layer 105 is obtained and the electrical resistance of the p-type semiconductor layer 104 can be lowered.

Generally, as the growing temperature becomes higher, the electrical resistance of the p-type semiconductor layer becomes lower. Therefore, from the viewpoint of the electrical resistance, the p-type semiconductor layer is desirably made to grow at a high temperature. However, in a case in which the active layer is formed before the p-type semiconductor layer, if the p-type semiconductor layer is formed at a high temperature as described above, a temperature of the active layer also becomes high during the formation of the p-type semiconductor layer and is susceptible to damage caused by heat. Especially when InGaN is used for the active layer, as an In composition becomes higher, the active layer becomes more susceptible to damage. An InGaN layer in which an In composition used for a light emitting device of a light emission band of 400 nm is about 10% is not susceptible to damage, but an InGaN layer contained in a long wavelength light emitting device is susceptible to damage. For example, an InGaN layer in which an In composition used for a light emitting device of a light emission band of 450 nm is about 20% and an InGaN layer in which an In composition used for a light emitting device of a light emission band of 530 nm is about 30% are susceptible to damage. These InGaN layers are susceptible to reduction in quality or are thermally decomposed. Such damage may be suppressed by lowering a growing temperature of the p-type semiconductor layer, but lowering of the growing temperature may increase the electrical resistance.

In the present embodiment, the active layer 105 may be formed after the p-type semiconductor layer 104 is formed. Therefore, even if the p-type semiconductor layer 104 is formed at a high temperature, the active layer 105 is not damaged by heat. Therefore, the p-type semiconductor layer 104 is desirably made to grow at a high temperature. Specifically, a growing temperature of the p-type semiconductor layer 104 is preferably 100° C. or higher, more preferably 200° C. or higher, and particularly preferably 1000° C. or higher, than a growing temperature of the active layer 105.

The electrical resistance of the second n-type semiconductor layer 106 formed after the active layer 105 is less susceptible to the growing temperature than the p-type semiconductor layer 104. Therefore, the second n-type semiconductor layer 106 may be formed at a temperature at which damage to the active layer 105 is not easily caused by heat. A difference in growing temperature between the active layer 105 and the second n-type semiconductor layer 106 is preferably 200° C. or smaller, and more preferably 100° C. or smaller.

Furthermore, as described above, Mg used as a p-type impurity tends to be diffuse in the laminating direction (the direction away from the substrate). For example, in a light emitting device according to a comparative example in which a lower n-type semiconductor layer, an active layer, a p-type semiconductor layer, a tunnel junction layer and an upper n-type semiconductor layer are formed in this order on a substrate, Mg contained in high-concentration in the tunnel junction layer tends to diffuse toward the upper n-type semiconductor layer. In this structure, since the tunnel junction layer includes the high-concentration p-type semiconductor layer on the p-type semiconductor layer side and the high-concentration n-type semiconductor layer on the upper n-type semiconductor layer side, Mg contained in the high-concentration p-type semiconductor layer tends to diffuse into the high-concentration p-type semiconductor layer and the upper n-type semiconductor layer. Further, when a current-confined structure with a tunnel junction layer partially formed therein is provided, Mg tends to diffuse from the p-type semiconductor layer to the upper n-type semiconductor layer even in an area in which no tunnel junction layer is provided. When Mg is mixed into the upper n-type semiconductor layer, since holes generated from Mg compensate for the electrons, electron concentration in the upper n-type semiconductor layer lowers.

In addition, since Mg has deep level activation energy and is activated several % to 10% at room temperature, Mg is doped at concentration of $10^{19}$ cm$^{-3}$ to $10^{20}$ cm$^{-3}$ that is about one to two orders of magnitude higher than concentration of n-type impurities such as Si. For this reason, since Mg may be mixed into the upper n-type semiconductor layer at higher concentration than the n-type impurity, carrier scattering caused by the impurity may be further increased and an electron mobility may be lowered.

In a light emitting device according to a comparative example in which a lower n-type semiconductor layer, an active layer, a p-type semiconductor layer, a tunnel junction layer, and an upper n-type semiconductor layer are formed in this order on a substrate, lowering in the electron concentration and lowering in the electron mobility tend to significantly increase the electrical resistance of the upper n-type semiconductor layer.

Furthermore, as an impurity profile in the tunnel junction layer becomes steeper, the electrical resistance of the tunnel junction layer becomes lower. However, as the impurity profile becomes steeper, Mg easily diffuses in the laminating direction and is easily mixed into the upper n-type semiconductor layer.

By contrast, in the present embodiment, the first n-type semiconductor layer 102 and the high-concentration n-type semiconductor layer of the tunnel junction layer may be formed closer to the substrate 101 than the high-concentration p-type semiconductor layer. Therefore, mixing of Mg from the high-concentration p-type semiconductor layer into the first n-type semiconductor layer 102 and the high-concentration n-type semiconductor layer may be reduced significantly.

Therefore, even if a tunnel junction layer with a high impurity concentration and a steep impurity profile is used, it is possible to reduce an increase in the electrical resistance of the first n-type semiconductor layer 102 caused by mixing of Mg.

Regarding the method of manufacturing the light emitting device 100, the first exemplary method (FIGS. 2A and 2B) is more desirable than the second exemplary method (FIGS. 3A and 3B) in terms of the number of times of formation (crystal growth) of continuous semiconductor layers. In the first exemplary method, the formation of the first n-type semiconductor layer 102 and the laminated structure 153 before the formation of the dry etching mask 191, and the formation of the p-type semiconductor layer 104, the active layer 105, and the second n-type semiconductor layer 106 after the removal of the dry etching mask 191 are performed. In the second exemplary method, the formation of the first n-type semiconductor layer 102 before the formation of the growth inhibition mask 192, the formation of the projecting portion 103 after the formation and before the removal of the growth inhibition mask 192, and the formation of the p-type semiconductor layer 104, the active layer 105, and the second n-type semiconductor layer 106 after removal of the growth inhibition mask 192 are performed. Thus, the number of times of formation (crystal growth) of the continuous semiconductor layers is two in the first exemplary method, and three in the second exemplary method. Therefore, the first exemplary method is more desirable than the second exemplary method.

A thickness of the projecting portion 103 is not particularly limited. When the thickness of the projecting portion 103 is less than 50 nm, the p-type semiconductor layer 104 is easily formed to be substantially flat on the projecting portion 103, and a thickness, mixed crystal composition, and the like of the semiconductor layer such as the active layer 105 formed on the p-type semiconductor layer 104 are easily controlled. Even if the thickness of the projecting portion 103 is 50 nm or more, by forming the p-type semiconductor layer 104 under the condition that atoms easily migrate, it is easy to form the p-type semiconductor layer 104 substantially flat, and control a thickness, mixed crystal composition, and the like of the semiconductor layer such as the active layer 105. When the semiconductor layer has stable thickness, mixed crystal composition, and the like, the light emitting device also has stable characteristics.

The semiconductor layer formed above the projecting portion 103 may or may not have projection caused by the projecting portion 103. In the case in which the p-type semiconductor layer 104 is formed by MOCVD, migration of atoms is accelerated by increasing a V/III ratio, which is a supply ratio of the group V (nitrogen) material and the group III material, or by depressurizing the chamber, whereby reducing the projection. Further, by performing a heat treatment while supplying a nitrogen material after the formation of the p-type semiconductor layer 104, migration of atoms can be accelerated, and the projection can be reduced.

Modification of First Embodiment

Next, a modification of the first embodiment is described.

In the present modification, the refractive index of the p-type semiconductor layer 104 is lower than an average refractive index of the projecting portion 103. For example, the tunnel junction layer included in the projecting portion 103 may be formed of a p-type GaN layer and an n-type GaN layer, and the p-type semiconductor layer 104 may be a p-type AlGaN layer. Also, for example, the tunnel junction layer included in the projecting portion 103 may be formed of a p-type InGaN layer and an n-type InGaN layer, and the p-type semiconductor layer 104 may be a p-type GaN layer or a p-type AlGaN layer. Other configurations are the same as those of the first embodiment.

According to the present modification, a light-confining structure can be implemented by a difference in refractive index. That is, according to the present modification, the light-confining structure in the in-plane direction of the substrate 101 can be implemented. By implementing the light-confining structure, the light emitting device 100 with a low threshold can be obtained.

Furthermore, in the present modification, the light-confining structure may be formed near the active layer 105 by using a thin p-type semiconductor layer 104. By forming the light-confining structure near the active layer 105, overlapping of light can be increased between the p-type semiconductor layer 104 and an amplification portion (a portion in which a current flows and light is amplified) of the active layer 105. A distance between the tunnel junction layer having the light-confining structure and the active layer 105 is preferably 120 nm or less, more preferably 100 nm or less, and still more preferably 50 nm or less.

Further, by providing a semiconductor layer having a refractive index higher than that of the p-type semiconductor layer 104 on the active layer 105 side of the tunnel junction layer or the substrate 101 side, or on both of these sides, the average refractive index of the projecting portion 103 becomes higher and light can be confined more strictly in the in-plane direction. The light may also be confined strictly by making the refractive index of the semiconductor layer provided on the active layer 105 of the tunnel junction layer side or the substrate 101 side, or on both of these sides match the refractive index of the light-confining structure of the light emitting device 100. For example, in an edge emitting laser, the average refractive index of the projecting portion 103 is also increased by providing a semiconductor layer having a high refractive index above the tunnel junction layer near the active layer 105. Therefore, the light can be confined more strictly in the laminating direction and the light can be confined more strictly in the in-plane direction of the substrate 101 at the same time. Further, a low refractive index semiconductor layer may be provided below the tunnel junction layer far from the active layer 105 to such an extent that the average refractive index of the projecting portion 103 does not become lower than the refractive index of the p-type semiconductor layer 104.

Second Embodiment

Figure 4:
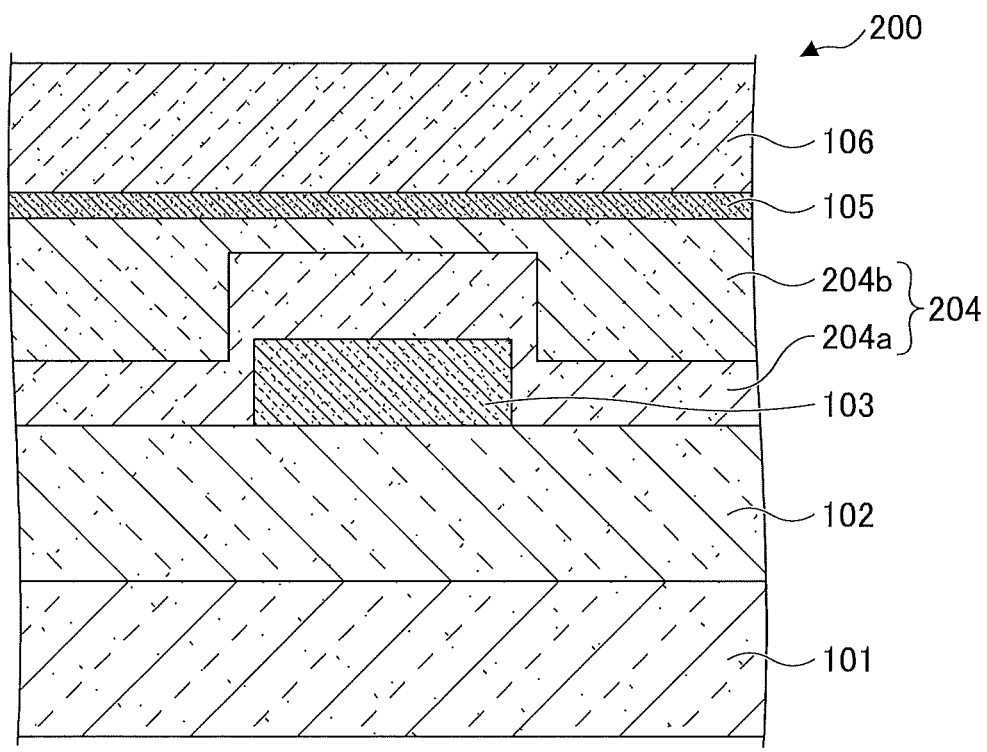
FIG. 4 is a cross-sectional view illustrating a light emitting device according to a second embodiment.

Next, a second embodiment is described. The second embodiment differs from the first embodiment in the configuration of the p-type semiconductor layer. FIG. 4 is a cross-sectional view illustrating a light emitting device according to the second embodiment.

A light emitting device 200 according to the second embodiment includes a p-type semiconductor layer 204 instead of the p-type semiconductor layer 104. The p-type semiconductor layer 204 covers the projecting portion 103 in the same manner as the p-type semiconductor layer 104. The p-type semiconductor layer 204 includes a high refractive index layer 204a having a first refractive index, and a low refractive index layer 204b having a second refractive index formed on the high refractive index layer 204a. The second refractive index is lower than the first refractive index. For example, the high refractive index layer 204a is a GaN layer and the low refractive index layer 204b is an AlGaN layer. The high refractive index layer 204a has a projection caused by the projecting portion 103 on a surface thereof, whereas a surface of the low refractive index layer 204b is substantially flat. Therefore, a thickness of the low refractive index layer 204b in a portion above the projecting portion 103 is smaller than a thickness of the low refractive index layer 204b in a portion separated from the projecting portion 103 in a plan view. Other configurations are the same as those of the first embodiment.

In the light emitting device 200, the low refractive index layer 204b is thinner in an area (first area) overlapping with the projecting portion 103 in a plan view than an area (second area) separated from the projecting portion 103. For this reason, an effective refractive index above the projecting portion 103 is higher than an effective refractive index in an area separated from the projecting portion 103 in a plan view. Therefore, a light-confining structure is implemented. By implementing the light-confining structure, the light emitting device 200 with a low threshold can be obtained.

The number of semiconductor layers included in the p-type semiconductor layer 204 having different refractive indices may be three or greater. Further, instead of the p-type semiconductor layer 204, compositionally graded layers of a p-type semiconductor may be used in which the refractive index decreases continuously from the first n-type semiconductor layer 102 side to the active layer 105 side.

Figure 5A:
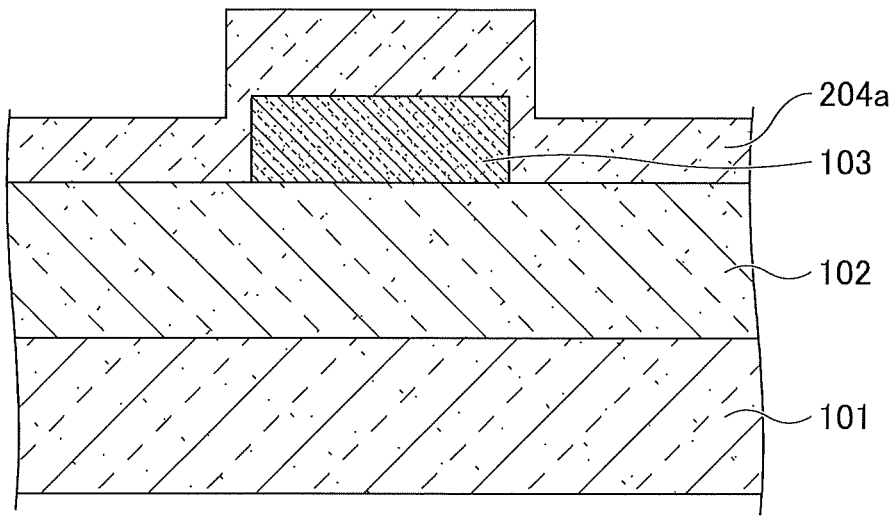
FIG. 5A is a first cross-sectional view illustrating a method of manufacturing the light emitting device according to the second embodiment.
Figure 5B:
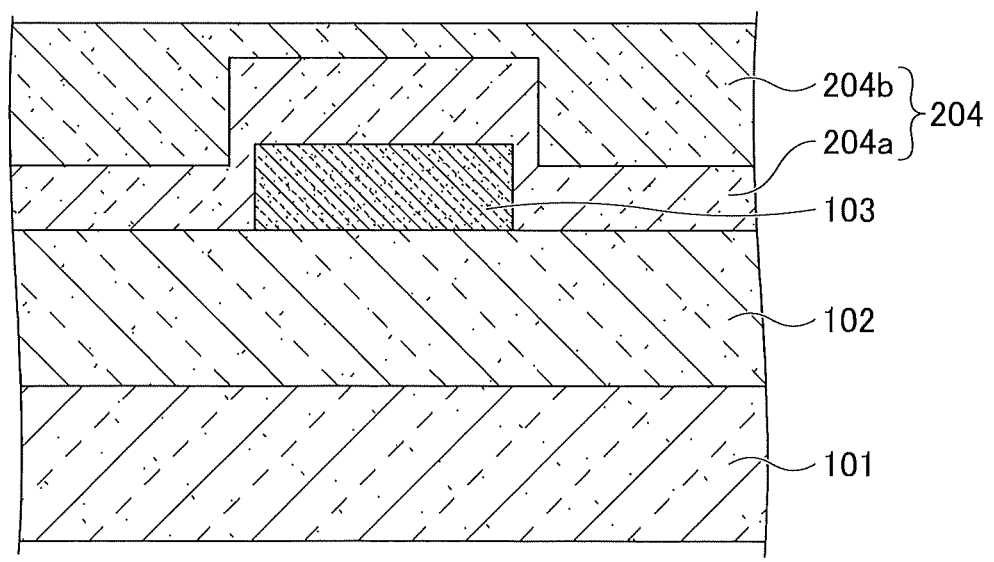
FIG. 5B is a second cross-sectional view illustrating the method of manufacturing the light emitting device according to the second embodiment.

Next, a method of manufacturing the light emitting device 200 according to the second embodiment is described. FIGS. 5A and 5B are cross-sectional views illustrating a method of manufacturing the light emitting device 200 according to the second embodiment.

First, as illustrated in FIG. 5A, the first n-type semiconductor layer 102 and the projecting portion 103 are formed on the substrate 101 in the same manner as in the first embodiment. The projecting portion 103 may be formed by any method of the first and second embodiments. Next, as also illustrated in FIG. 5A, the high refractive index layer 204a is formed on the first n-type semiconductor layer 102. At this time, the high refractive index layer 204a is formed under the condition that the surface thereof has a projection caused by the projecting portion 103. The high refractive index layer 204a may be formed, for example, by MOCVD, MBE, HVPE, or sputtering.

Thereafter, as illustrated in FIG. 5B, the low refractive index layer 204b is formed on the high refractive index layer 204a. At this time, the low refractive index layer 204b is formed under the condition that the surface becomes substantially flat. The low refractive index layer 204b may be formed by, for example, MOCVD, MBE, HVPE, or sputtering.

Subsequently, the active layer 105 and the second n-type semiconductor layer 106 are formed on the low refractive index layer 204b (see FIG. 4). The active layer 105 and the second n-type semiconductor layer 106 may be formed by, for example, MOCVD, MBE, HVPE, or sputtering.

In this manner, the light emitting device 200 according to the second embodiment is manufactured.

Third Embodiment

Figure 6:
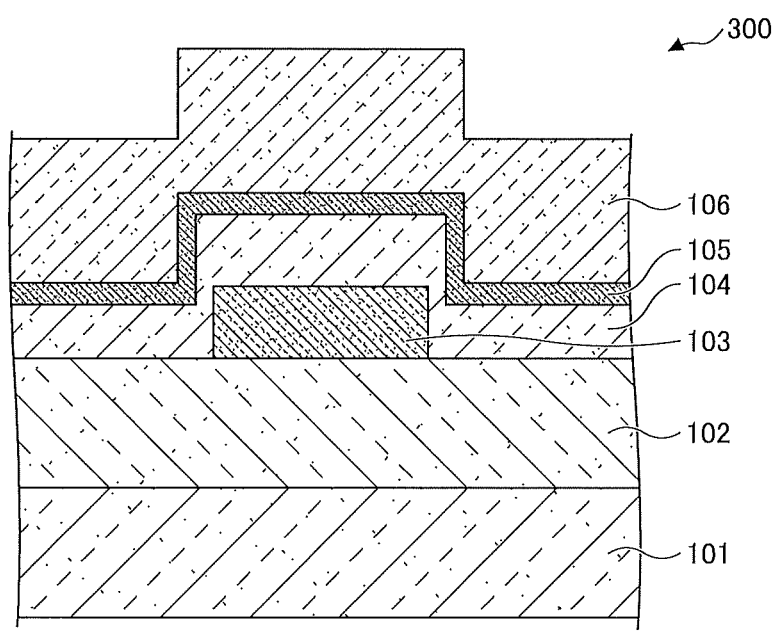
FIG. 6 is a cross-sectional view illustrating a light emitting device according to a third embodiment.

Next, a third embodiment is described. The third embodiment differs from the first embodiment in the configuration of the projecting portion, the p-type semiconductor layer, the active layer, and the second n-type semiconductor layer. FIG. 6 is a cross-sectional view illustrating a light emitting device according to the third embodiment.

In a light emitting device 300 according to the third embodiment, the projecting portion 103 is formed to be thicker than the projecting portion 103 in the first embodiment. For example, the thickness of the projecting portion 103 is 50 nm or greater. In the first embodiment, the surface of the p-type semiconductor layer 104 is substantially flat. In the third embodiment, a surface of the p-type semiconductor layer 104 has a projection caused by the projecting portion 103. Similarly, the active layer 105 and the second n-type semiconductor layer 106 also have a projection caused by the projecting portion 103. Other configurations are the same as those of the first embodiment.

In the light emitting device 300, the active layer 105 and the second n-type semiconductor layer 106 are located next to each other in the in-plane direction of the substrate 101 above the projecting portion 103. In the portion in which the active layer 105 and the second n-type semiconductor layer 106 are located next to each other, the active layer 105 is located between the projecting portion 103 and the second n-type semiconductor layer 106 in a plan view. Therefore, if the refractive index of the active layer 105 is higher than those of the p-type semiconductor layer 104 and the second n-type semiconductor layer 106, distribution of the refractive index occurs also in the in-plane direction of the substrate 101 and the light-confining structure is implemented in the active layer 105 above the projecting portion 103. By implementing the light-confining structure, the light emitting device 300 with a low threshold can be obtained.

Note that the surface of the second n-type semiconductor layer 106 may be substantially flat.

Figure 7A:
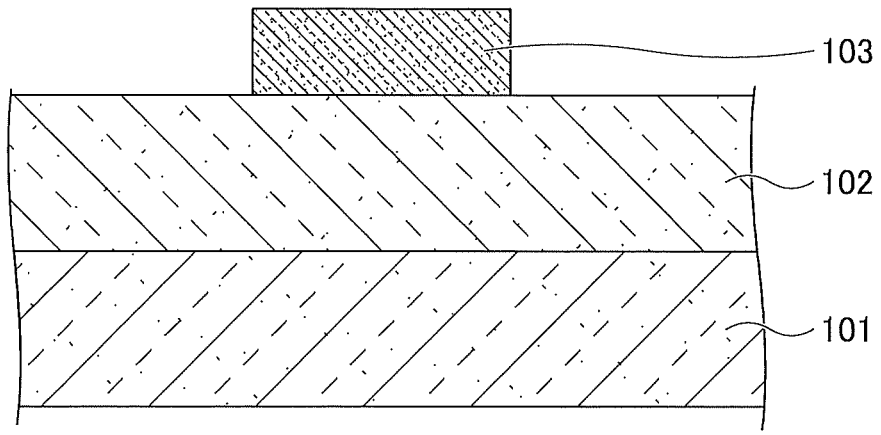
FIG. 7A is a first cross-sectional view illustrating a method of manufacturing the light emitting device according to the third embodiment.
Figure 7B:
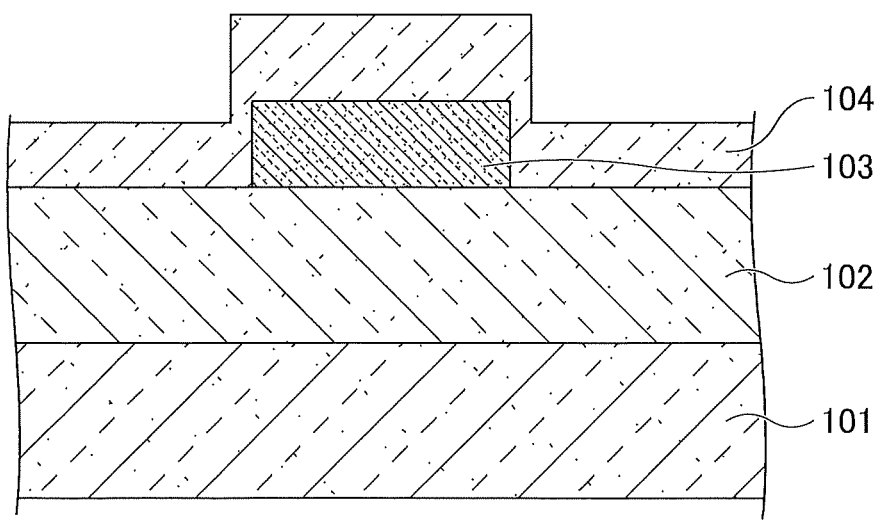
FIG. 7B is a second cross-sectional view illustrating the method of manufacturing the light emitting device according to the third embodiment.

Next, a method of manufacturing the light emitting device 300 according to the third embodiment is described. FIGS. 7A and 7B are cross-sectional views illustrating a method of manufacturing the light emitting device 300 according to the third embodiment.

First, as illustrated in FIG. 7A, the first n-type semiconductor layer 102 and the projecting portion 103 are formed on the substrate 101 in the same manner as in the first embodiment. The thickness of the projecting portion 103 is greater than that of the first embodiment and is set to, for example, 50 nm or more. The projecting portion 103 may be formed by any method of the first and second embodiments.

Next, as illustrated in FIG. 7B, the p-type semiconductor layer 104 is formed on the first n-type semiconductor layer 102. At this time, the p-type semiconductor layer 104 is fruited under the condition that the surface thereof has a projection caused by the projecting portion 103. The p-type semiconductor layer 104 may be formed by, for example, MOCVD, MBE, HVPE, or sputtering.

Thereafter, the active layer 105 and the second n-type semiconductor layer 106 are formed on the p-type semiconductor layer 104 (see FIG. 6). The active layer 105 and the second n-type semiconductor layer 106 may be formed by, for example, MOCVD, MBE, HVPE, or sputtering.

In this manner, the light emitting device 300 according to the third embodiment is manufactured.

Fourth Embodiment

Figure 8:
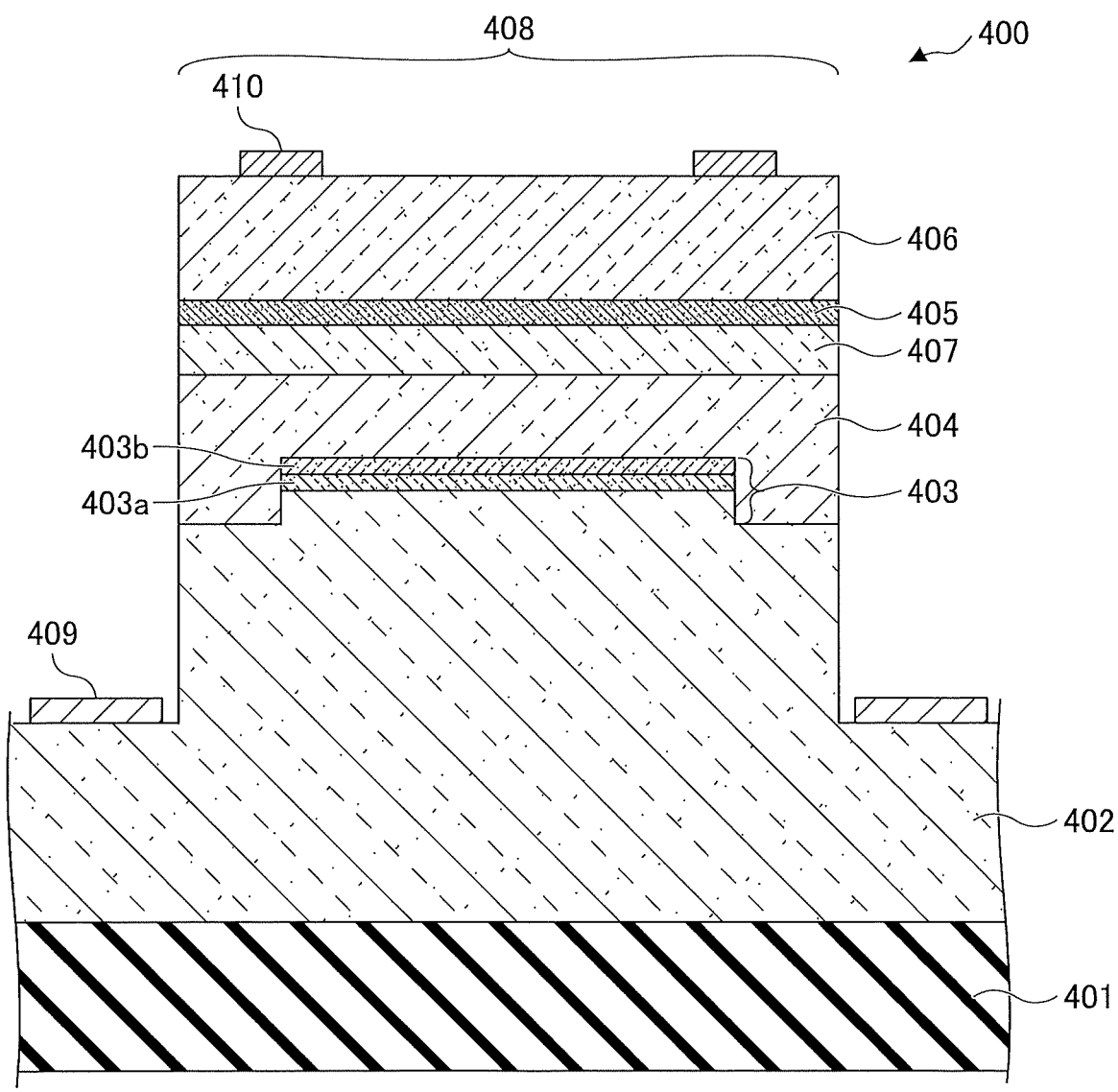
FIG. 8 is a cross-sectional view illustrating a light emitting device according to a fourth embodiment.

Next, a fourth embodiment is described. The fourth embodiment relates to a light emitting device in which a nitride semiconductor is used. FIG. 8 is a cross-sectional view illustrating a light emitting device according to the fourth embodiment.

A light emitting device 400 according to the fourth embodiment includes: a sapphire substrate 401; an n-GaN layer 402 on the sapphire substrate 401; an $n^{++}$-GaN layer 403a on the n-GaN layer 402; and a $p^{++}$-GaN layer 403b on the $n^{++}$-GaN layer 403a. For example, the $p^{++}$-GaN layer 403b is doped with about $10^{20}$ cm$^{-3}$ of Mg, the $n^{++}$-GaN layer 403a is doped with about $10^{20}$ cm$^{-3}$ of Si or Ge, and the $p^{++}$-GaN layer 403b and the $n^{++}$-GaN layer 403a form a tunnel junction layer. A part of the $p^{++}$-GaN layer 403b, a part of the $n^{++}$-GaN layer 403a, and a part of the n-GaN layer 402 are etched to form a projecting portion 403. That is, the projecting portion 403 includes a part (surface layer part) of the n-GaN layer 402 and a tunnel junction layer. The projecting portion 403 does not necessarily have to include the n-GaN layer 402, and the projecting portion 403 may be formed of a tunnel junction layer.

The light emitting device 400 further includes: a p-GaN layer 404 on the n-GaN layer 402; a p-AlGaN layer 407 on the p-GaN layer 404; a multi-quantum wells layer 405 on the p-AlGaN layer 407; and an n-GaN layer 406 on the multi-quantum wells layer 405. For example, the p-GaN layer 404 covers the projecting portion 403 from above and from the sides. The multi-quantum wells layer 405 is an example of an active layer, and includes InGaN layers and GaN layers that are alternately laminated. The p-AlGaN layer 407 functions as an electron block layer and blocks transfer of electrons from the multi-quantum wells layer 405 to the p-GaN layer 404.

A part of the n-GaN layer 406, a part of the multi-quantum wells layer 405, a part of the p-AlGaN layer 407, a part of the p-GaN layer 404, and a part of the n-GaN layer 402 are etched to form a mesa structure 408 as an element isolation structure. An anode electrode 409 is formed on an upper surface of the n-GaN layer 402 around the mesa structure 408. For example, the anode electrode 409 includes a Ti film and an Al film on the Ti film. A cathode electrode 410 is formed on an upper surface of the n-GaN layer 406 in an area separated from the projecting portion 403 in a plan view. The cathode electrode 410 includes a Ti film and an Al film on the Ti film.

Next, a method of manufacturing the light emitting device 400 according to the fourth embodiment is described. FIGS. 9A to 9D are cross-sectional views illustrating a method of manufacturing the light emitting device 400 according to the fourth embodiment.

Figure 9A:
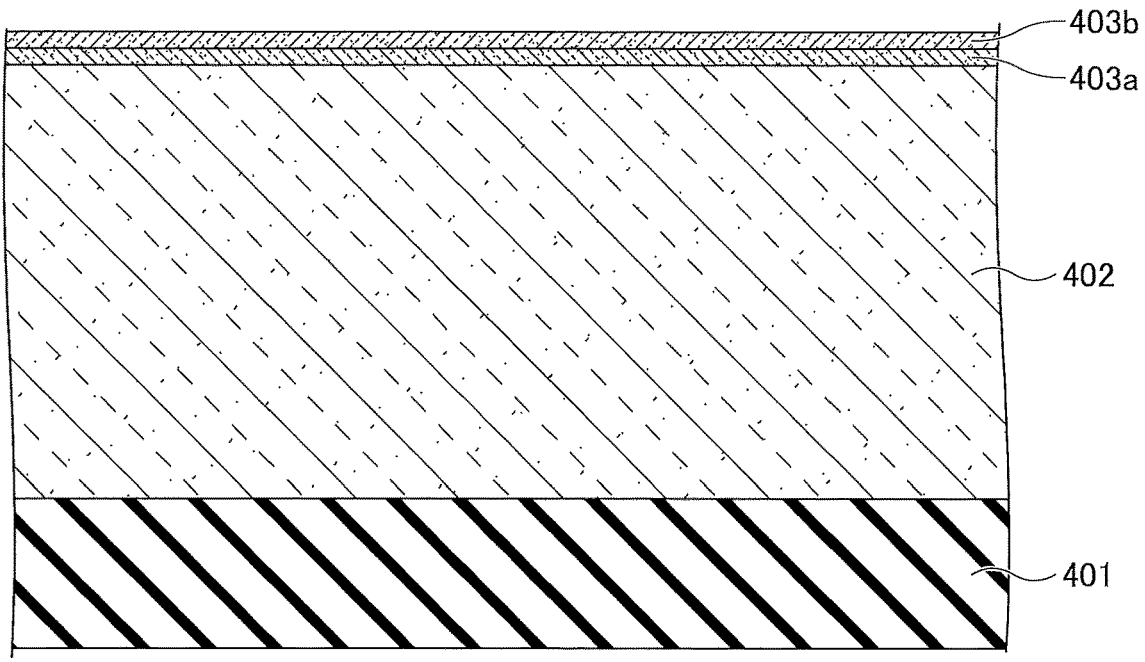
FIG. 9A is a first cross-sectional view illustrating a method of manufacturing the light emitting device according to the fourth embodiment.

First, as illustrated in FIG. 9A, the n-GaN layer 402, the $n^{++}$-GaN layer 403a and the $p^{++}$-GaN layer 403b are made to grow on the sapphire substrate 401 via a low temperature buffer layer (not illustrated) using an MOCVD apparatus. For example, a growing temperature is 1150° C., a thickness of the n-GaN layer 402 is 5 μm, a thickness of the $n^{++}$-GaN layer 403a is 10 nm, and a thickness of the $p^{++}$-GaN layer 403b is 5 nm.

Figure 9B:
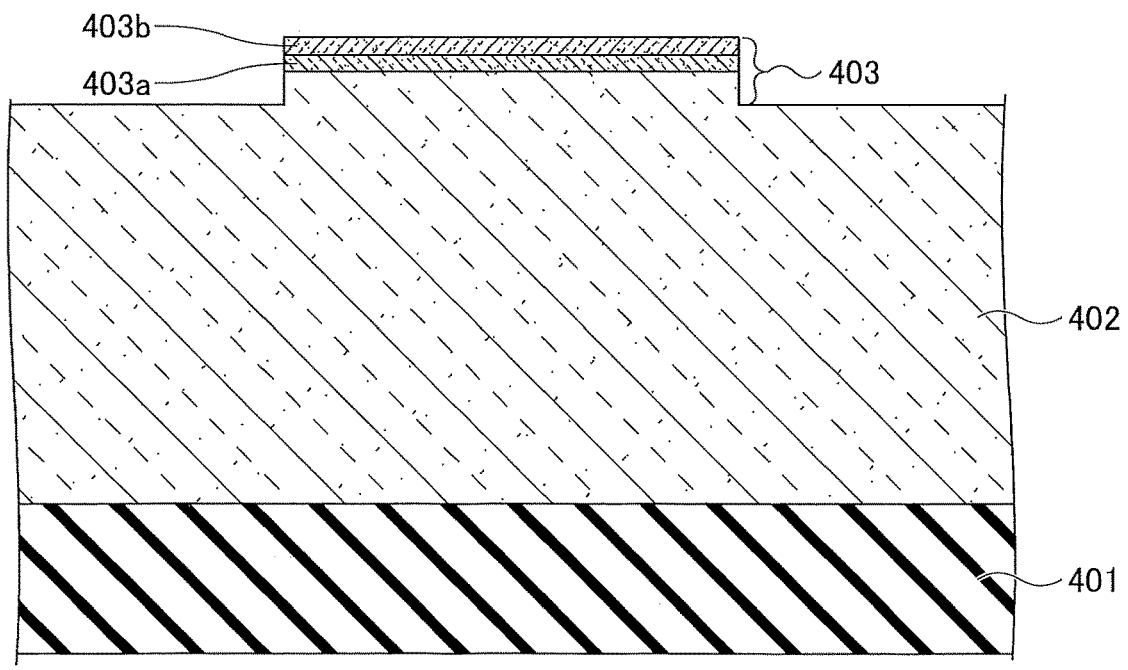
FIG. 9B is a second cross-sectional view illustrating the method of manufacturing the light emitting device according to the fourth embodiment.

Next, as illustrated to FIG. 9B, the projecting portion 403 is formed. In the formation of the projecting portion 403, the laminated structure (the sapphire substrate 401 and the like) illustrated in FIG. 9A is taken out of the MOCVD apparatus, and a dry etching mask (not illustrated) is formed by photolithography on the p$^{++}$-GaN layer 403b to cover the light emitting device 400 in an area in which a current flows, that is, an area in which the projecting portion 403 is to be formed. As a dry etching mask, for example, a SiO$_2$ film that is circular in a plan view and has a diameter of 10 μm is formed. Next, the projecting portion 403 is formed by dry-etching the p$^{++}$-GaN layer 403b, the n$^{++}$-GaN layer 403a, and the n-GaN layer 402 by using the dry etching mask. A depth to etch is set to, for example, 30 nm in order to reliably remove the tunnel junction layer in an area in which no current flows. However, the etching may be ended when the etching of the n$^{++}$-GaN layer 403a is completed and the n-GaN layer 402 is exposed. That is, the n-GaN layer 402 does not necessarily have to be etched. After the projecting portion 403 is formed, the dry etching mask is removed.

Figure 9C:
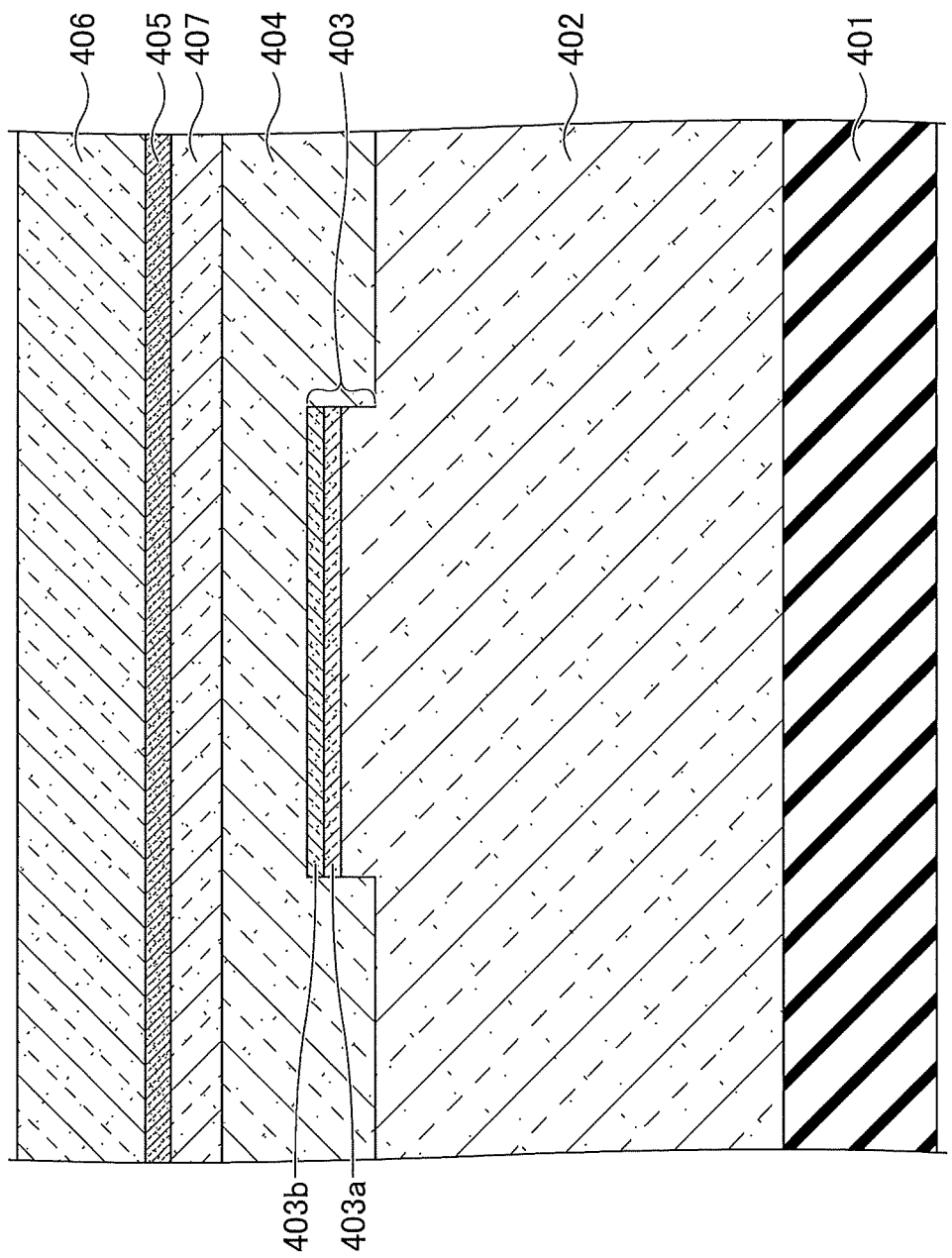
FIG. 9C is a third cross-sectional view illustrating the method of manufacturing the light emitting device according to the fourth embodiment.

Thereafter, as illustrated in FIG. 9C, the p-GaN layer 404, the p-AlGaN layer 407, the multi-quantum wells layer 405, and the n-GaN layer 406 are made to grow on the n-GaN layer 402 by using an MOCVD apparatus. For example, a growing temperature of the p-GaN layer 404 and the p-AlGaN layer 407 is 1150° C., a thickness of the p-GaN layer 404 is 50 nm on the projecting portion 403, and a thickness of the p-AlGaN layer 407 is 20 nm. During the formation of the p-GaN layer 404, the projection caused by the projecting portion 403 is eliminated, and the thickness of the p-GaN layer 404 becomes 80 nm on the sides of the projecting portion 403. For example, a growing temperature of the multi-quantum wells layer 405 is 800° C., and in the growth of the multi-quantum wells layer 405, 3 nm-thick InGaN layers and 7 nm-thick GaN layers are alternately laminated five times. For example, a growing temperature of the n-GaN layer 406 is 900° C., and a thickness of the n-GaN layer 406 is 200 nm.

Next, as illustrated in FIG. 9D, a mesa structure 408 is formed as an element isolation structure. In the formation of the mesa structure 408, the laminated structure (the sapphire substrate 401 and the like) illustrated in FIG. 9C is taken out of the MOCVD apparatus, and a part of the n-GaN layer 406, a part of the multi-quantum wells layer 405, a part of the p-AlGaN layer 407, a part of the p-GaN layer 404, and a part of the n-GaN layer 402 are dry-etched. For example, the mesa structure 408 is circular in a plan view and has a diameter of 50 μm. Next, the laminated structure (the sapphire substrate 401 and the like) illustrated in FIG. 9D is subject to a heat treatment in an oxygen atmosphere to desorb hydrogen contained in the p$^{++}$-GaN layer 403b, the p-GaN layer 404, and the p-AlGaN layer 407, and to activate Mg.

Thereafter, the anode electrode 409 is formed on the upper surface of the n-GaN layer 402 around the mesa structure 408, and the cathode electrode 410 is formed on the upper surface of the n-GaN layer 406 in an area separated from the projecting portion 403 in a plan view (see FIG. 8). For example, the anode electrode 409 and the cathode electrode 410 include a Ti film and an Al film on the Ti film.

In this manner, the light emitting device 400 according to the fourth embodiment is manufactured.

According to the fourth embodiment, in the light emitting device 400, the p-GaN layer 404 that covers the projecting portion 403 including the tunnel junction layer is formed on the n-GaN layer 402, and the multi-quantum wells layer 405 is formed on the p-GaN layer 404. That is, in the present embodiment, the multi-quantum wells layer 405 may be formed after the projecting portion 403 including the tunnel junction layer is formed. Therefore, according to the present embodiment, it is possible to reduce damage and leakage currents that would have occurred in the light emitting device according to a comparative example. Therefore, the thickness of the p-GaN layer 404 between the tunnel junction layer and the multi-quantum wells layer 405 can be reduced, and the electrical resistance of the light emitting device 400 can be lowered.

Further, the p-GaN layer 404 can be formed at a high temperature. Therefore, a favorable multi-quantum wells layer 405 is obtained and the electrical resistance of the p-GaN layer 404 can be lowered.

Furthermore, even if a tunnel junction layer with a high impurity concentration and a steep impurity profile is used, it is possible to reduce an increase in the electrical resistance of the n-GaN layer 402 caused by the mixing of Mg.

Fifth Embodiment

Figure 10:
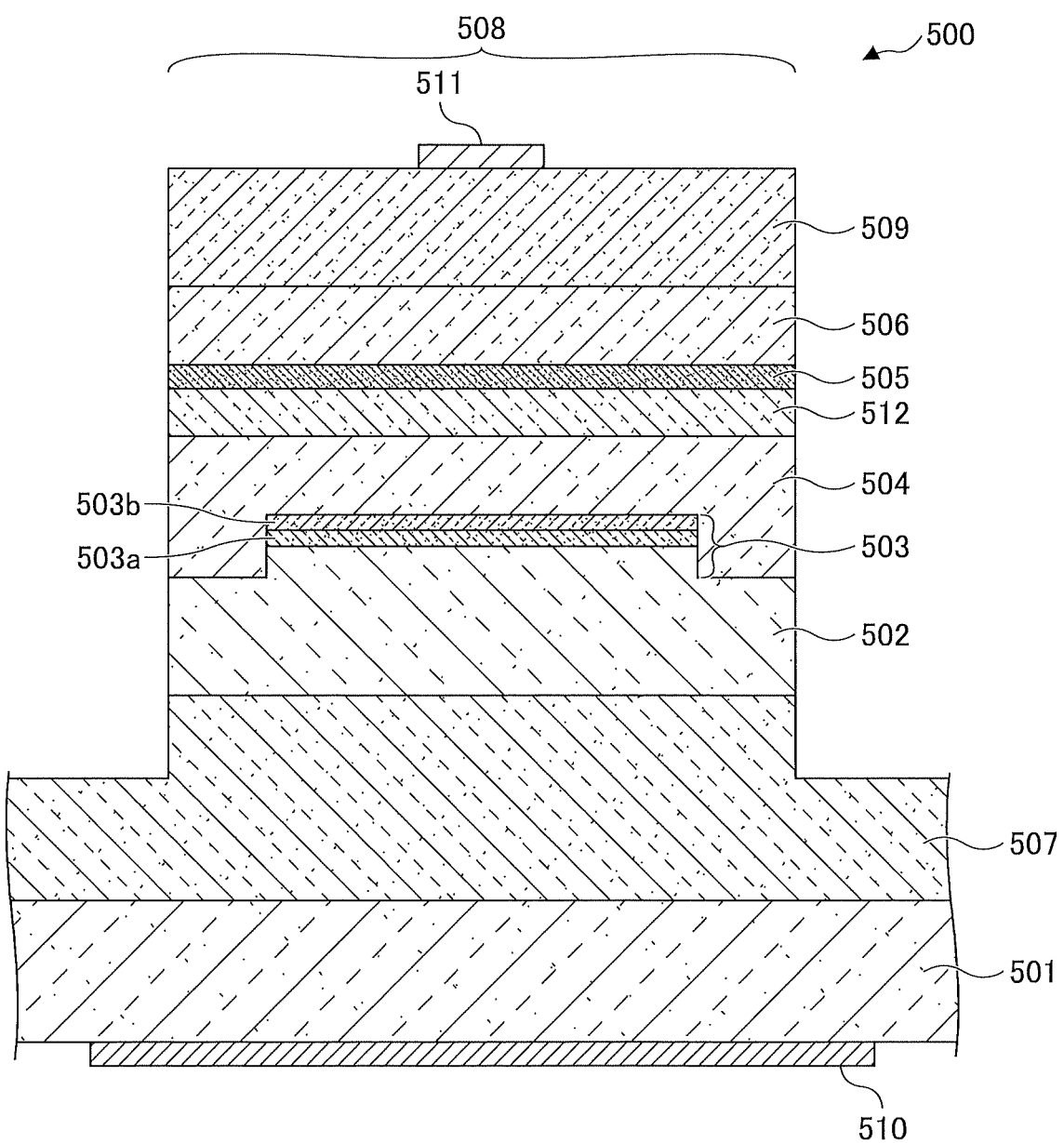
FIG. 10 is a cross-sectional view illustrating a light emitting device according to a fifth embodiment.

Next, a fifth embodiment is described. The fifth embodiment relates to an edge emitting laser as an exemplary light emitting device in which a nitride semiconductor is used. FIG. 10 is a cross-sectional view illustrating a light emitting device according to the fifth embodiment.

A light emitting device 500 according to the fifth embodiment includes: an n-GaN substrate 501; an n-AlGaN layer 507 on the n-GaN substrate 501; an n-GaN layer 502 on the n-AlGaN layer 507; an n$^{++}$-InGaN layer 503a on the n-GaN layer 502; and a p$^{++}$-InGaN layer 503b on the n$^{++}$-InGaN layer 503a. For example, the p$^{++}$-InGaN layer 503b is doped with about $10^{20}$ cm$^{-3}$ of Mg, the n$^{++}$-InGaN layer 503a is doped with about $10^{20}$ cm$^{-3}$ of Si or Ge, and the p$^{++}$-InGaN layer 503b and the n$^{++}$-InGaN layer 503a form a tunnel junction layer. A part of the p$^{++}$-InGaN layer 503b, a part of the n$^{++}$-InGaN layer 503a, and a part of the n-GaN layer 502 are etched to form a projecting portion 503. That is, the projecting portion 503 includes a part (surface layer part) of the n-GaN layer 502 and a tunnel junction layer. The projecting portion 503 does not necessarily have to include the n-GaN layer 502, and the projecting portion 503 may be formed of a tunnel junction layer.

The light emitting device 500 further includes: a p-GaN layer 504 on the n-GaN layer 502; a p-AlGaN layer 512 on the p-GaN layer 504; a multi-quantum wells layer 505 on the p-AlGaN layer 512; an n-GaN layer 506 on the multi-quantum wells layer 505; and an n-AlGaN layer 509 on the n-GaN layer 506. For example, the p-GaN layer 504 covers the projecting portion 503 from above and from the sides. The multi-quantum wells layer 505 is an example of an active layer, and includes InGaN layers and GaN layers that are alternately laminated. The p-AlGaN layer 512 functions as an electron block layer and blocks transfer of electrons from the multi-quantum wells layer 505 to the p-GaN layer 504.

A part of the n-AlGaN layer 509, a part of the n-GaN layer 506, a part of the multi-quantum wells layer 505, a part of the p-AlGaN layer 512, a part of the p-GaN layer 504, a part of the n-GaN layer 502, and a part of the n-AlGaN layer 507 are etched to form a mesa structure 508 as an element isolation structure. An anode electrode 510 is formed on a lower surface of the n-GaN substrate 501. The anode electrode 510 includes, for example, a Ti film and an Al film on the Ti film. A cathode electrode 511 is formed on an upper surface of the n-AlGaN layer 509. The cathode electrode 511 includes a Ti film and an Al film on the Ti film.

Next, a method of manufacturing the light emitting device 500 according to the fifth embodiment is described. FIGS.

11A to 11D are cross-sectional views illustrating a method of manufacturing the light emitting device 500 according to the fifth embodiment.

First, as illustrated in FIG. 11A, the n-AlGaN layer 507, the n-GaN layer 502, the n$^{++}$-InGaN layer 503a and the p$^{++}$-InGaN layer 503b are made to grow on the n-GaN substrate 501 by using an MOCVD apparatus. For example, a growing temperature of the n-AlGaN layer 507 and the n-GaN layer 502 is 1150° C., a thickness of the n-AlGaN layer 507 is 600 nm, and a thickness of the n-GaN layer 502 is 100 nm. For example, a growing temperature of the n$^{++}$-InGaN layer 503a and the p$^{++}$-InGaN layer 503b is 850° C., a thickness of the n$^{++}$-InGaN layer 503a is 10 nm, and a thickness of the p$^{++}$-InGaN layer 503b is 10 nm.

Next, as illustrated in FIG. 11B, the projecting portion 503 is formed. In the formation of the projecting portion 503, the laminated structure (the n-GaN substrate 501 and the like) illustrated in FIG. 11A is taken out of the MOCVD apparatus, and a dry etching mask (not illustrated) is formed by photolithography on the p$^{++}$-InGaN layer 503b to cover the light emitting device 500 in an area in which a current flows, that is, an area in which the projecting portion 503 is to be formed. As a dry etching mask, for example, a SiO$_2$ film that is rectangular in a plan view and has a width of 5 μm is formed. Next, the projecting portion 503 is formed by dry-etching the p$^{++}$-InGaN layer 503b, the n$^{++}$-InGaN layer 503a, and the n-GaN layer 502 by using a dry etching mask. A depth to etch is set to, for example, 40 nm in order to reliably remove the tunnel junction layer in an area in which no current flows. However, the etching may be ended when the etching of the n$^{++}$-InGaN layer 503a is completed and the n-GaN layer 502 is exposed. That is, the n-GaN layer 502 does not necessarily have to be etched. After the projecting portion 503 is formed, the dry etching mask is removed.

Figure 11C:
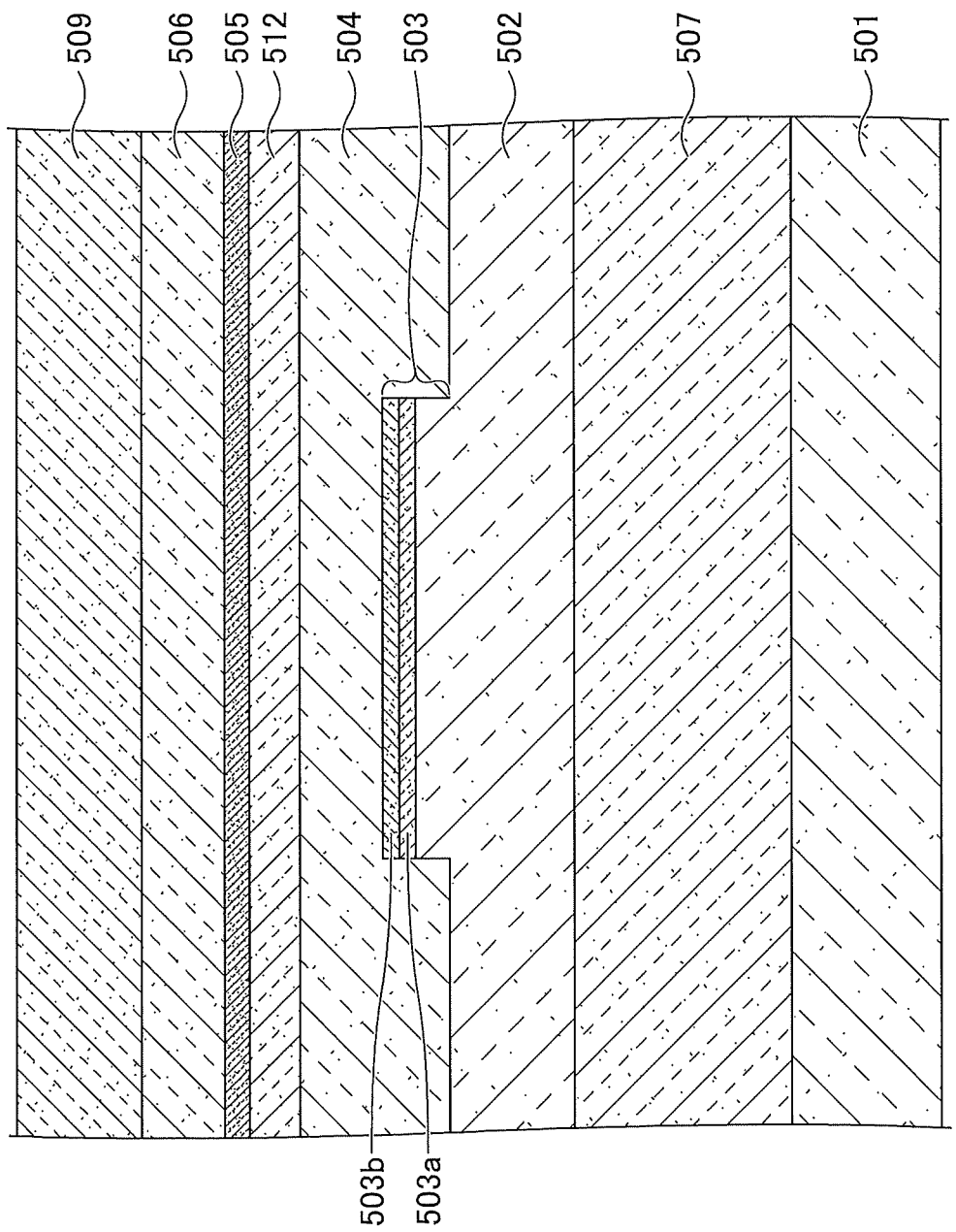
FIG. 11C is a third cross-sectional view illustrating the method of manufacturing the light emitting device according to the fifth embodiment.

Thereafter, as illustrated in FIG. 11C, the p-GaN layer 504, the p-AlGaN layer 512, the multi-quantum wells layer 505, the n-GaN layer 506, and the n-AlGaN layer 509 are made to grow on the n-GaN layer 502 by using an MOCVD apparatus. For example, a growing temperature of the p-GaN layer 504 and the p-AlGaN layer 512 is 1000° C., a thickness of the p-GaN layer 504 is set to 20 nm on the projecting portion 503, and a thickness of the p-AlGaN layer 512 is 20 nm. During the formation of the p-GaN layer 504, the projection caused by the projecting portion 503 is eliminated, and the thickness of the p-GaN layer 504 becomes 60 nm on the sides of the projecting portion 503. For example, the growing temperature of the multi-quantum wells layer 505 is 750° C., and in the growth of the multi-quantum wells layer 505, 3 nm-thick InGaN layers and 7 nm-thick GaN layers are alternately laminated five times. For example, a growing temperature of the n-GaN layer 506 and the n-AlGaN layer 509 is 850° C., a thickness of the n-GaN layer 506 is 120 nm, and a thickness of the n-AlGaN layer 509 is 500 nm.

Figure 11D:
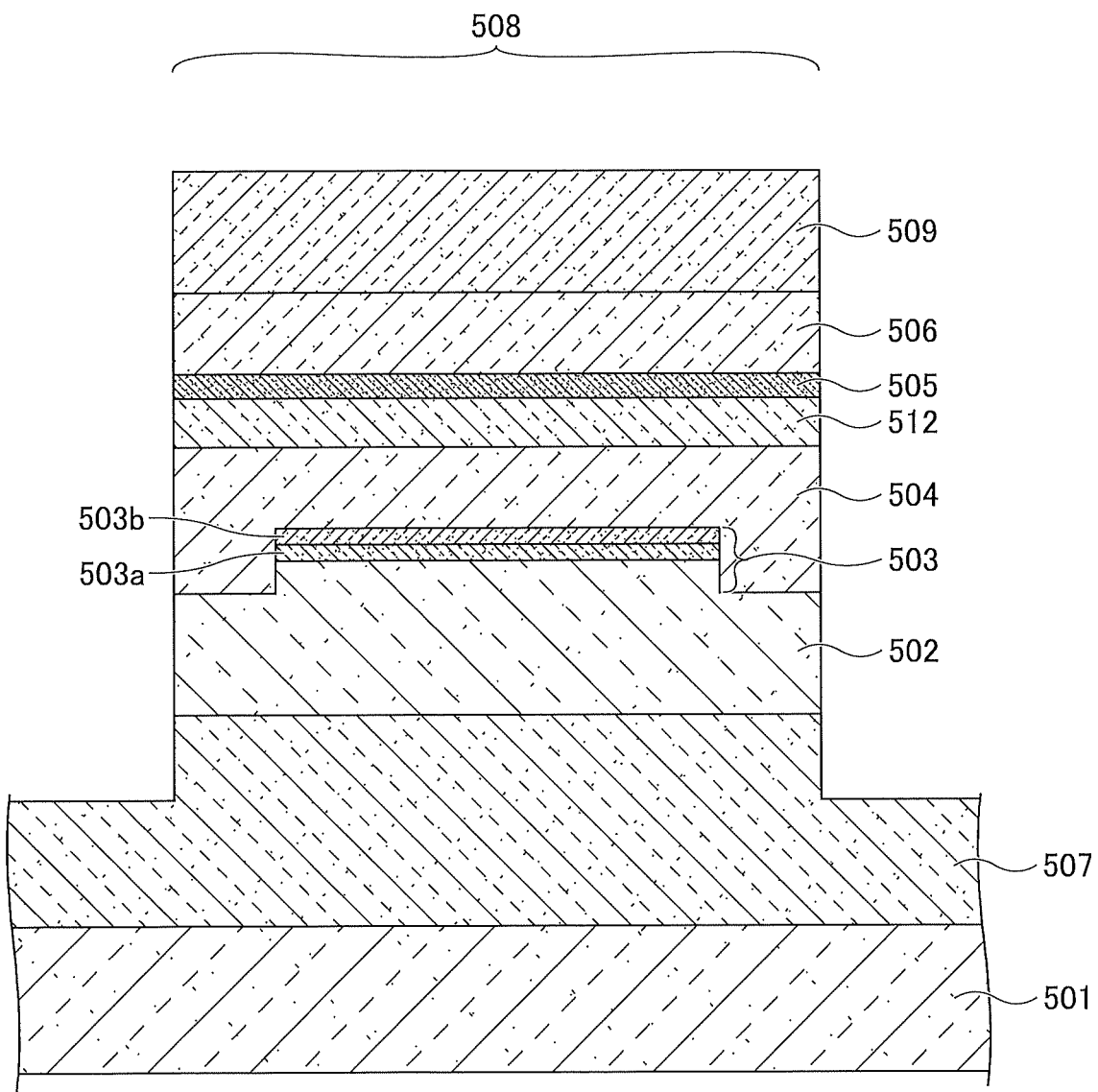
FIG. 11D is a fourth cross-sectional view illustrating the method of manufacturing the light emitting device according to the fifth embodiment.

Next, as illustrated in FIG. 11D, the mesa structure 508 is formed as an element isolation structure. In the formation of the mesa structure 508, the laminated structure (the n-GaN substrate 501 and the like) illustrated in FIG. 11C is taken out of the MOCVD apparatus, and a part of the n-AlGaN layer 509, a part of the n-GaN layer 506, a part of the multi-quantum wells layer 505, a part of the p-AlGaN layer 512, a part of the p-GaN layer 504, a part of the n-GaN layer 502, and a part of the n-AlGaN layer 507 are dry-etched. For example, the mesa structure 508 is rectangular in a plan view having a width of 200 μm. Next, the laminated structure (the n-GaN substrate 501 and the like) illustrated in FIG. 11D is subject to a heat treatment in an oxygen atmosphere to desorb hydrogen contained in the p$^{++}$-InGaN layer 503b, the p-GaN layer 504, and the p-AlGaN layer 512, and to activate Mg.

Thereafter, the anode electrode 510 is formed on the lower surface of the n-GaN substrate 501, and the cathode electrode 511 is formed on the upper surface of the n-AlGaN layer 509 (see FIG. 10). For example, the anode electrode 510 and the cathode electrode 511 include a Ti film and an Al film on the Ti film.

In this manner, the light emitting device 500 according to the fifth embodiment is manufactured.

In the light emitting device 500, a refractive index of the n$^{++}$-InGaN layer 503a and the p$^{++}$-InGaN layer 503b forming the tunnel junction layer is higher than a refractive index of the p-GaN layer 504. Therefore, the light-confining structure in the in-plane direction of the substrate 501 can be implemented by the projecting portion 503. Therefore, a strong light-confining effect can be obtained in the edge emitting laser.

Sixth Embodiment

Figure 12:
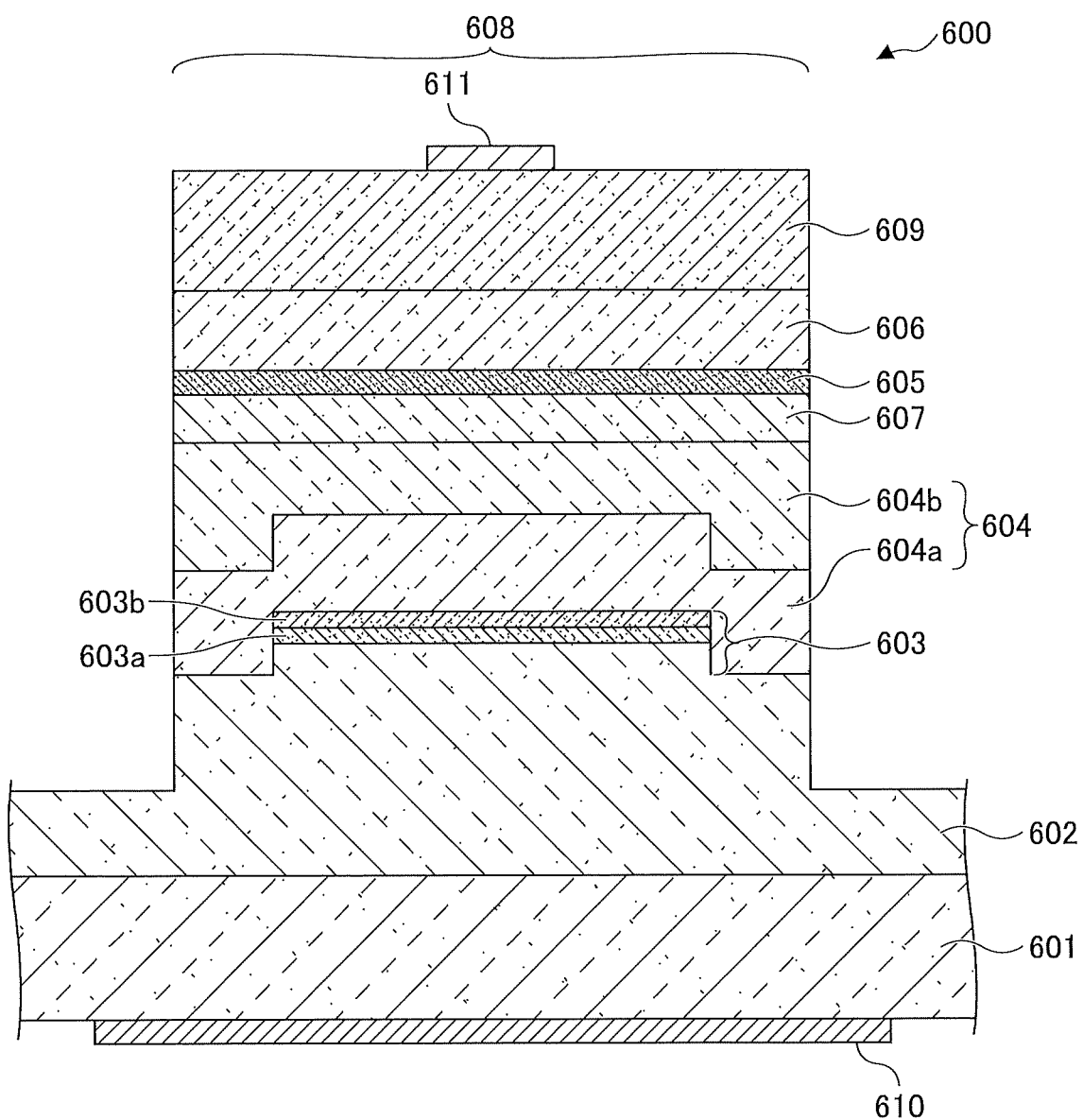
FIG. 12 is a cross-sectional view illustrating a light emitting device according to a sixth embodiment.

Next, a sixth embodiment is described. The sixth embodiment relates to an edge emitting laser as an exemplary light emitting device in which a nitride semiconductor is used. FIG. 12 is a cross-sectional view illustrating a light emitting device according to the sixth embodiment.

A light emitting device 600 according to the sixth embodiment includes: an n-GaN substrate 601; an n-AlGaN layer 602 on the n-GaN substrate 601; an n$^{++}$-GaN layer 603a on the n-AlGaN layer 602; and a p-GaN layer 603b on the n$^{++}$-GaN layer 603a. For example, the p$^{++}$-GaN layer 603b is doped with about $10^{20}$ cm$^{-3}$ of Mg, the n$^{++}$-GaN layer 603a is doped with about $10^{20}$ cm$^{-3}$ of Si or Ge, and the p$^{++}$-GaN layer 603b and the n$^{++}$-GaN layer 603a form a tunnel junction layer. A part of the p$^{++}$-GaN layer 603b, a part of the n$^{++}$-GaN layer 603a, and a part of the n-AlGaN layer 602 are etched to form a projecting portion 603. That is, the projecting portion 603 includes a part (surface layer part) of the n-AlGaN layer 602 and a tunnel junction layer. The projecting portion 603 does not necessarily have to include the n-AlGaN layer 602, and the projecting portion 603 may be formed of a tunnel junction layer.

The light emitting device 600 further includes: a p-GaN layer 604a on the n-AlGaN layer 602; a p-AlGaN layer 604b on the p-GaN layer 604a; a p-AlGaN layer 607 on the p-AlGaN layer 604b; a multi-quantum wells layer 605 on the p-AlGaN layer 607; an n-GaN layer 606 on the multi-quantum wells layer 605; and an n-AlGaN layer 609 on the n-GaN layer 606. The p-GaN layer 604a and the p-AlGaN layer 604b are included in the p-type semiconductor layer 604. For example, the p-type semiconductor layer 604 covers the projecting portion 603 from above and from the sides. The multi-quantum wells layer 605 is an example of an active layer, and includes InGaN layers and GaN layers that are alternately laminated. The p-AlGaN layer 607 functions as an electron block layer and blocks transfer of electrons from the multi-quantum wells layer 605 to the p-type semiconductor layer 604.

A part of the n-AlGaN layer 609, a part of the n-GaN layer 606, a part of the multi-quantum wells layer 605, a part of the p-AlGaN layer 607, a part of the p-AlGaN layer 604b, a part of the p-GaN layer 604a, and a part of the n-AlGaN layer 602 are etched to form the mesa structure 608 as an element isolation structure. An anode electrode 610 is formed on a lower surface of the n-GaN substrate 601. The anode electrode 610 includes, for example, a Ti film and an Al film on the Ti film. A cathode electrode 611 is formed on an upper surface of the n-AlGaN layer 609. The cathode electrode 611 includes a Ti film and an Al film on the Ti film.

Next, a method of manufacturing the light emitting device 600 according to the sixth embodiment is described. FIGS. 13A to 13D are cross-sectional views illustrating a method of manufacturing the light emitting device 600 according to the sixth embodiment.

Figure 13A:
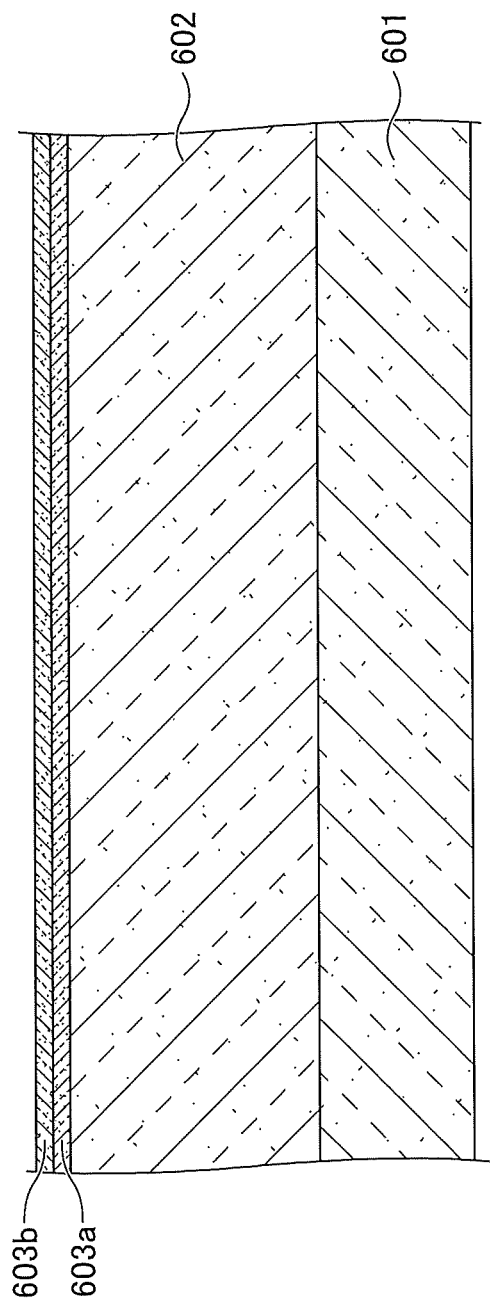
FIG. 13A is a first cross-sectional view illustrating a method of manufacturing the light emitting device according to the sixth embodiment.

First, as illustrated in FIG. 13A, an n-AlGaN layer 602, an n$^{++}$-GaN layer 603a, and a p$^{++}$-GaN layer 603b are made to grow on an n-GaN substrate 601 by using an MOCVD apparatus. For example, a growing temperature of the n-AlGaN layer 602, the n$^{++}$-GaN layer 603a, and the p$^{++}$-GaN layer 603b is 1100° C., a thickness of the n-AlGaN layer 602 is 600 nm, a thickness of the n$^{++}$-GaN layer 603a is 10 nm, and a thickness of the p$^{++}$-GaN layer 603b is 10 nm.

Figure 13B:
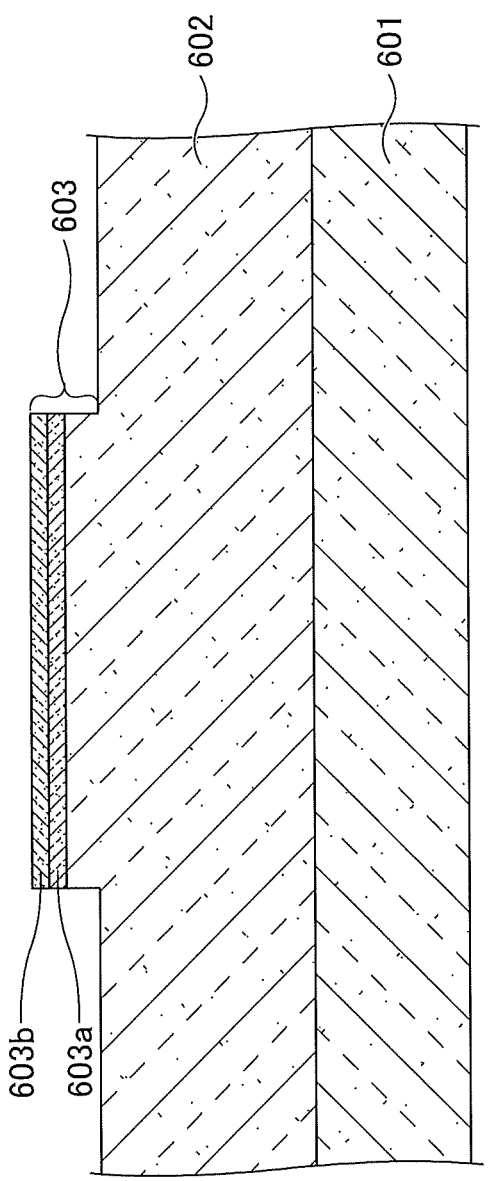
FIG. 13B is a second cross-sectional view illustrating the method of manufacturing the light emitting device according to the sixth embodiment.

Next, as illustrated in FIG. 13B, the projecting portion 603 is formed. In the formation of the projecting portion 603, the laminated structure (the n-GaN substrate 601 and the like) illustrated in FIG. 13A is taken out of the MOCVD apparatus, and a dry etching mask (not illustrated) is formed by photolithography on the p$^{++}$-GaN layer 603b to cover the light emitting device 600 in an area in which a current flows, that is, an area in which the projecting portion 603 is to be formed. As a dry etching mask, for example, a SiO$_2$ film that is rectangular in a plan view and has a width of 5 μm is formed. Next, the projecting portion 603 is formed by dry-etching the p$^{++}$-GaN layer 603b, the n$^{++}$-GaN layer 603a, and the n-AlGaN layer 602 by using the dry etching mask. A depth to etch is set to, for example, 40 nm in order to reliably remove the tunnel junction layer in an area in which no current flows. However, the etching may be ended when the etching of the n$^{++}$-GaN layer 603a is completed and the n-AlGaN layer 602 is exposed. That is, the n-AlGaN layer 602 does not necessarily have to be etched. After the projecting portion 603 is formed, the dry etching mask is removed.

Figure 13C:
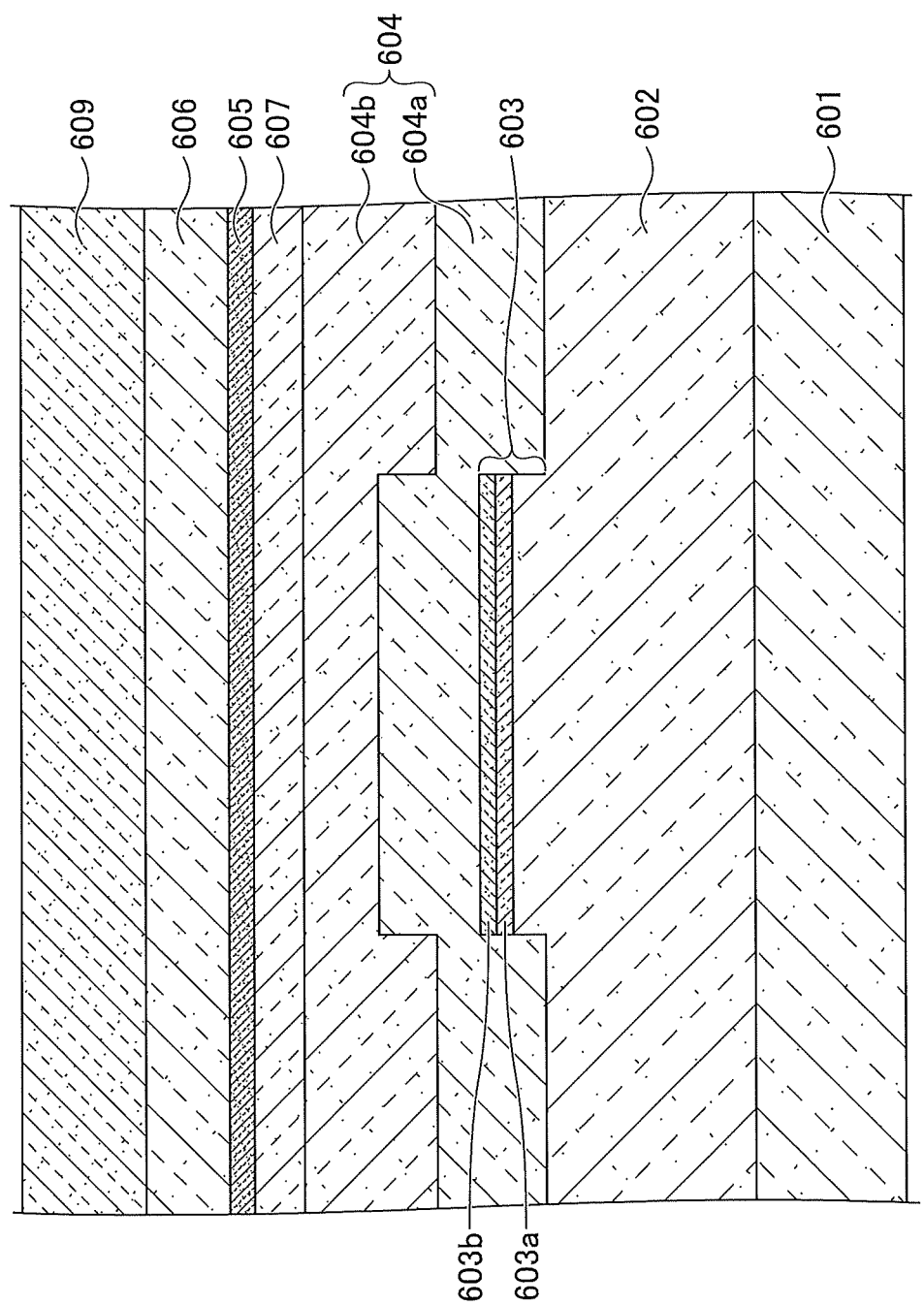
FIG. 13C is a third cross-sectional view illustrating the method of manufacturing the light emitting device according to the sixth embodiment.

Thereafter, as illustrated in FIG. 13C, the p-GaN layer 604a and the p-AlGaN layer 604b are made to grow on the n-AlGaN layer 602 by using an MOCVD apparatus. For example, a growing temperature of the p-GaN layer 604a and the p-AlGaN layer 604b is 1100° C., a thickness of the p-GaN layer 604a is 50 nm on the projecting portion 603, and a thickness of the p-AlGaN layer 604b is 50 nm on the projecting portion 603. During the formation of the p-GaN layer 604a, the projection caused by the projecting portion 603 is eliminated, and the thickness of the p-GaN layer 604a becomes 70 nm on the sides of the projecting portion 603. The size of the projection is reduced to about 20 nm. During the formation of the p-AlGaN layer 604b, the projection caused by the projecting portion 603 is further eliminated, and the thickness of the p-AlGaN layer 604b becomes 70 nm on the sides of the projecting portion 603. The projection substantially disappears and the surface of the p-AlGaN layer 604b becomes flat.

Subsequently, as also illustrated in FIG. 13C, a p-AlGaN layer 607, a multi-quantum wells layer 605, an n-GaN layer 606, and an n-AlGaN layer 609 are made to grow on the p-AlGaN layer 604b by using an MOCVD apparatus. For example, a growing temperature of the p-AlGaN layer 607 is 1100° C., and a thickness of the p-AlGaN layer 607 is 20 nm. For example, the growing temperature of the multi-quantum wells layer 605 is 800° C., and in the growth of the multi-quantum wells layer 605, 3 nm-thick InGaN layers and 7 nm-thick GaN layers are alternately laminated five times. For example, a growing temperature of the n-GaN layer 606 and the n-AlGaN layer 609 is 900° C., a thickness of the n-GaN layer 606 is 120 nm, and a thickness of the n-AlGaN layer 609 is 500 nm.

Figure 13D:
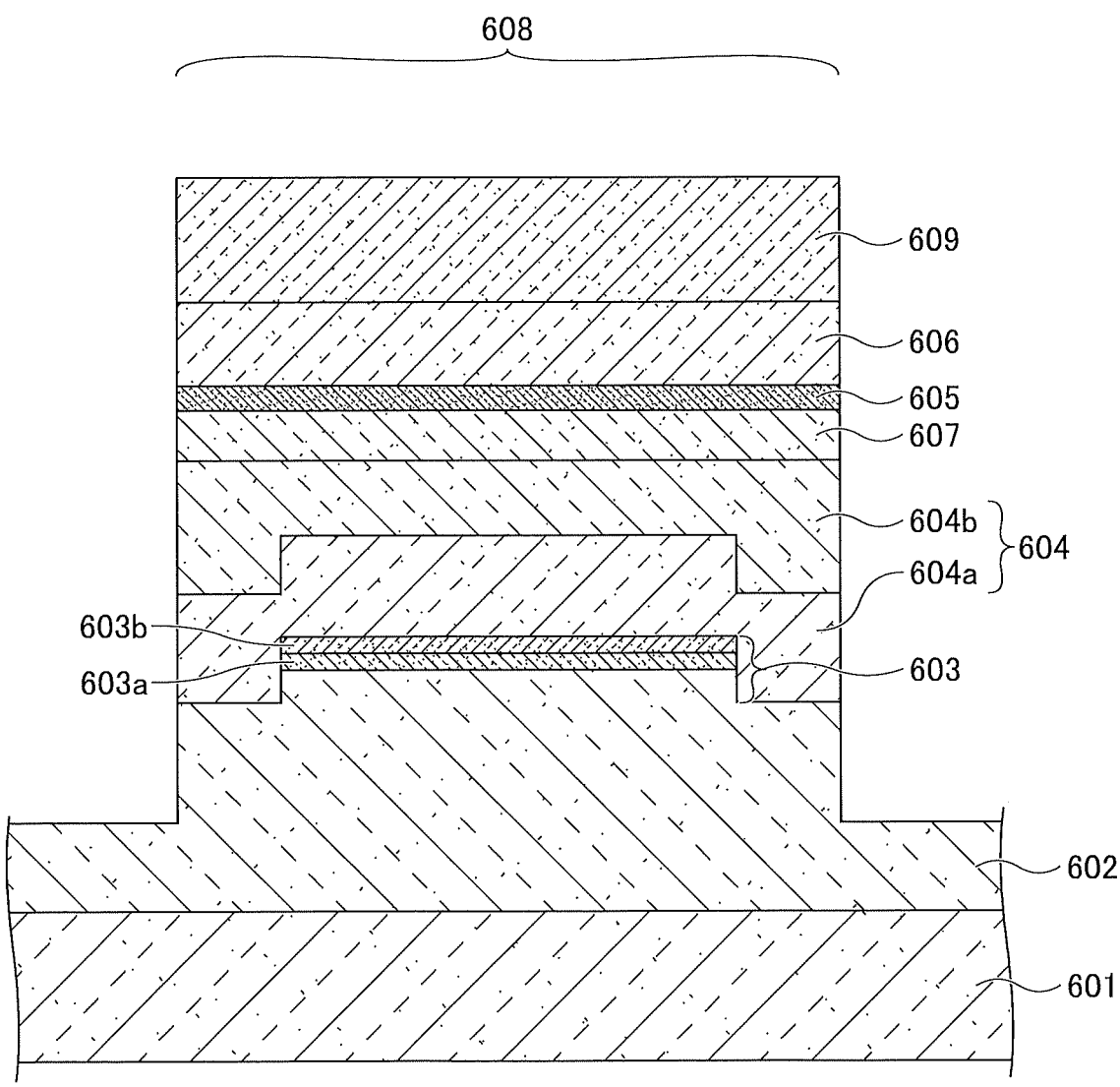
FIG. 13D is a fourth cross-sectional view illustrating the method of manufacturing the light emitting device according to the sixth embodiment.

Next, as illustrated in FIG. 13D, the mesa structure 608 is formed as an element isolation structure. In the formation of the mesa structure 608, the laminated structure (the n-GaN substrate 601 and the like) illustrated in FIG. 13C is taken out of the MOCVD apparatus, and a part of the n-AlGaN layer 609, a part of the n-GaN layer 606, a part of the multi-quantum wells layer 605, a part of the p-AlGaN layer 607, a part of the p-AlGaN layer 604b, a part of the p-GaN layer 604a, and a part of the n-AlGaN layer 602 are dry-etched. For example, the mesa structure 608 is rectangular in a plan view having a width of 200 μm. Next, the laminated structure (the n-GaN substrate 601 and the like) illustrated in FIG. 13D is subject to a heat treatment in an oxygen atmosphere to desorb hydrogen contained in the p$^{++}$-GaN layer 603b, the p-GaN layer 604a, the p-AlGaN layer 604b, and the p-AlGaN layer 607, and to activate Mg.

Subsequently, the anode electrode 610 is formed on the lower surface of the n-GaN substrate 601, and the cathode electrode 611 is formed on the upper surface of the n-AlGaN layer 609 (see FIG. 12). For example, the anode electrode 610 and the cathode electrode 611 include a Ti film and an Al film on the Ti film.

In this manner, the light emitting device 600 according to the sixth embodiment is manufactured.

In the light emitting device 600, the p-AlGaN layer 604b is thin above the projecting portion 603, and the p-AlGaN layer 604b is thick outside the projecting portion 603 in a plan view. Therefore, the effective refractive index on the projecting portion 603 becomes higher than the effective refractive index outside the projecting portion 603, whereby the light-confining structure is implemented. Therefore, a strong light-confining effect can be obtained in the edge emitting laser.

Seventh Embodiment

Figure 14:
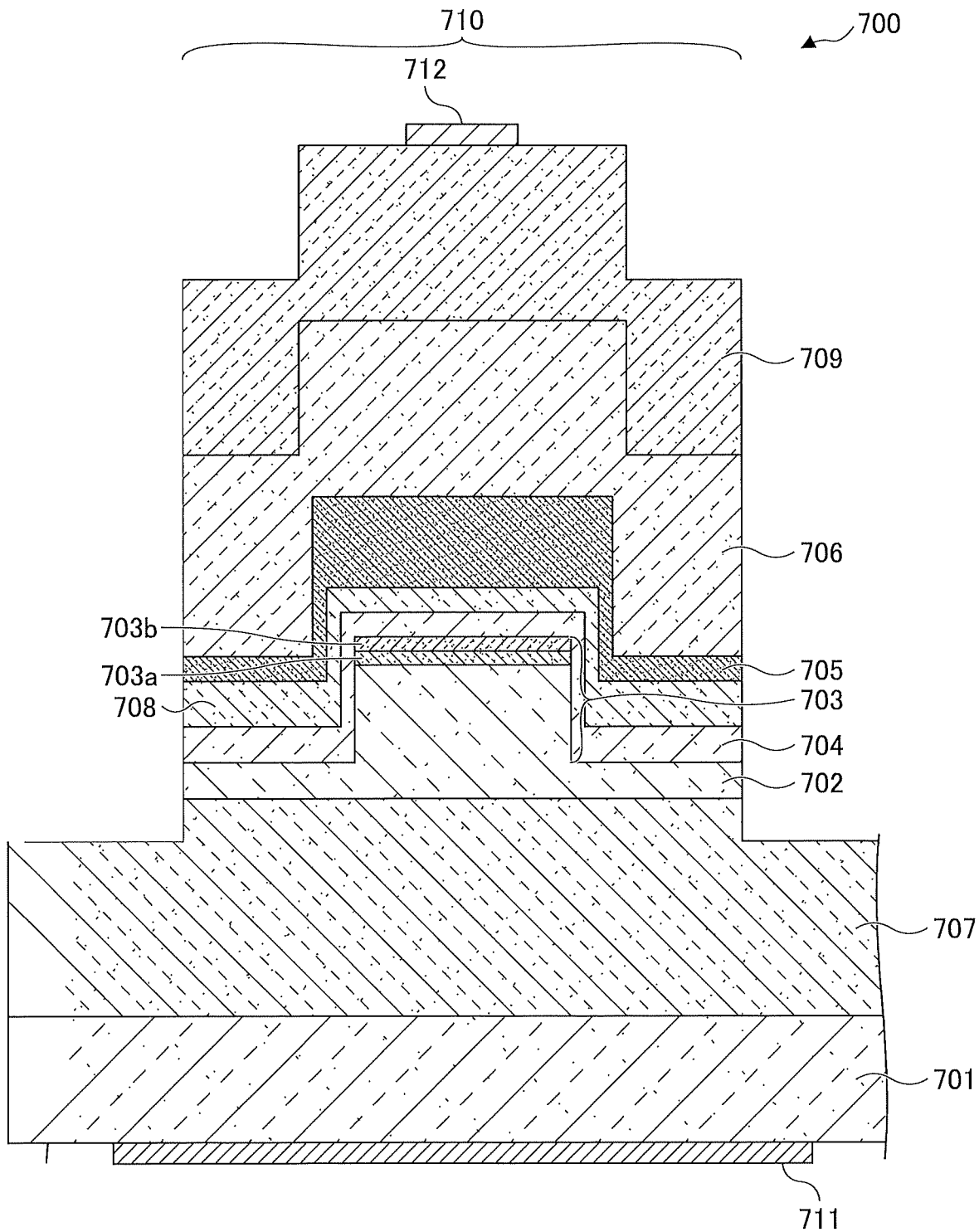
FIG. 14 is a cross-sectional view illustrating a light emitting device according to a seventh embodiment.

Next, a seventh embodiment is described. The seventh embodiment relates to an edge emitting laser as an exemplary light emitting device in which a nitride semiconductor is used. FIG. 14 is a cross-sectional view illustrating a light emitting device according to the seventh embodiment.

A light emitting device 700 according to the seventh embodiment includes: an n-GaN substrate 701; an n-AlGaN layer 707 on the n-GaN substrate 701; an n-GaN layer 702 on the n-AlGaN layer 707; an n$^{++}$-InGaN layer 703a on the n-GaN layer 702; and a p$^{++}$-InGaN layer 703b on the n$^{++}$-InGaN layer 703a. For example, the p$^{++}$-InGaN layer 703b is doped with about 10$^{20}$ cm$^{-3}$ of Mg, the n$^{++}$-InGaN layer 703a is doped with about 10$^{20}$ cm$^{-3}$ of Si or Ge, and the p$^{++}$-InGaN layer 703b and the n$^{++}$-InGaN layer 703a form a tunnel junction layer. A part of the p$^{++}$-InGaN layer 703b, a part of the n$^{++}$-InGaN layer 703a, and a part of the n-GaN layer 702 are etched to form a projecting portion 703. That is, the projecting portion 703 includes a part of the n-GaN layer 702 and a tunnel junction layer.

The light emitting device 700 further includes: a p-GaN layer 704 on the n-GaN layer 702; a p-AlGaN layer 708 on the p-GaN layer 704; a multi-quantum wells layer 705 on the p-AlGaN layer 708; an n-GaN layer 706 on the multi-quantum wells layer 705; and an n-AlGaN layer 709 on the n-GaN layer 706. For example, the p-GaN layer 704 covers the projecting portion 703 from above and from the sides. The multi-quantum wells layer 705 is an example of an active layer, and includes InGaN layers and GaN layers that are alternately laminated. The p-AlGaN layer 708 functions as an electron block layer and blocks transfer of electrons from the multi-quantum wells layer 705 to the p-GaN layer 704.

In the fifth embodiment, the surface of the p-GaN layer 504 is substantially flat. In the seventh embodiment, a surface of the p-GaN layer 704 has a projection caused by the projecting portion 703. Similarly, a surface of the p-AlGaN layer 708, a surface of the multi-quantum wells layer 705, a surface of the n-GaN layer 706, and a surface of the n-AlGaN layer 709 also has a projection caused by the projecting portion 703.

A part of the n-AlGaN layer 709, a part of the n-GaN layer 706, a part of the multi-quantum wells layer 705, a part of the p-AlGaN layer 708, a part of the p-GaN layer 704, a part of the n-GaN layer 702, and a part of the n-AlGaN layer 707 are etched to faun a mesa structure 710 as an element isolation structure. An anode electrode 711 is formed on a lower surface of the n-GaN substrate 701. The anode electrode 711 includes, for example, a Ti film and an Al film on the Ti film. A cathode electrode 712 is formed on an upper surface of the n-AlGaN layer 709. The cathode electrode 712 includes a Ti film and an Al film on the Ti film.

Next, a method of manufacturing the light emitting device 700 according to the seventh embodiment is described. FIGS. 15A to 15D are cross-sectional views illustrating a method of manufacturing the light emitting device 700 according to the seventh embodiment.

First, as illustrated in FIG. 15A, the n-AlGaN layer 707, the n-GaN layer 702, the n$^{++}$-InGaN layer 703a, and the p$^{++}$-InGaN layer 703b are made to grow on the n-GaN substrate 701 by using an MOCVD apparatus. For example, a growing temperature of the n-AlGaN layer 707 and the n-GaN layer 702 is 1000° C., a thickness of the n-AlGaN layer 707 is 600 nm, and a thickness of the n-GaN layer 702 is 100 nm. For example, a growing temperature of the n$^{++}$-InGaN layer 703a and the p$^{++}$-InGaN layer 703b is 900° C., a thickness of the n$^{++}$-InGaN layer 703a is 10 nm, and a thickness of the p$^{++}$-InGaN layer 703b is 10 nm.

Figure 15B:
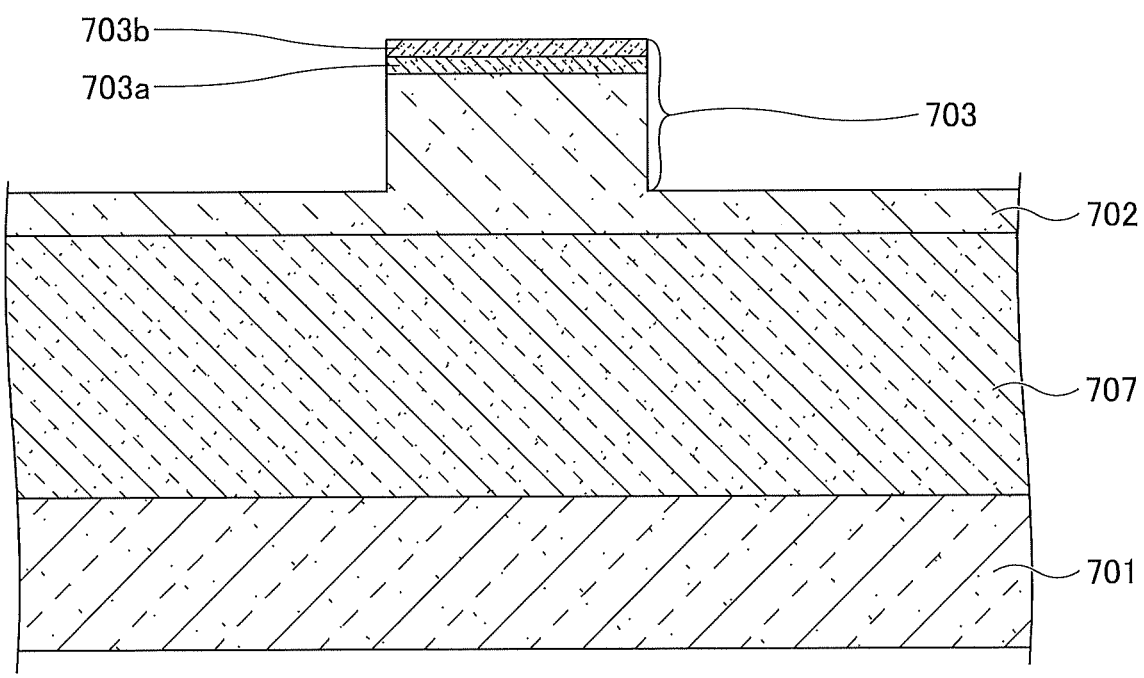
FIG. 15B is a second cross-sectional view illustrating the method of manufacturing the light emitting device according to the seventh embodiment.

Next, as illustrated in FIG. 15B, the projecting portion 703 is formed. In the formation of the projecting portion 703, the laminated structure (the n-GaN substrate 701 and the like) illustrated in FIG. 15A is taken out of the MOCVD apparatus, and a dry etching mask (not illustrated) is formed by photolithography on the p$^{++}$-InGaN layer 703b to cover the light emitting device 700 in an area in which a current flows, that is, an area in which the projecting portion 703 is to be formed. As a dry etching mask, for example, a SiO$_2$ film that is rectangular in a plan view and has a width of 5 μm is formed. Next, the projecting portion 703 is formed by dry-etching the p$^{++}$-InGaN layer 703b, the n$^{++}$-InGaN layer 703a, and the n-GaN layer 702 by using the dry etching mask. A depth to etch is set to, for example, 100 nm, and the projecting portion 703 includes a part of the n-GaN layer 702.

Figure 15C:
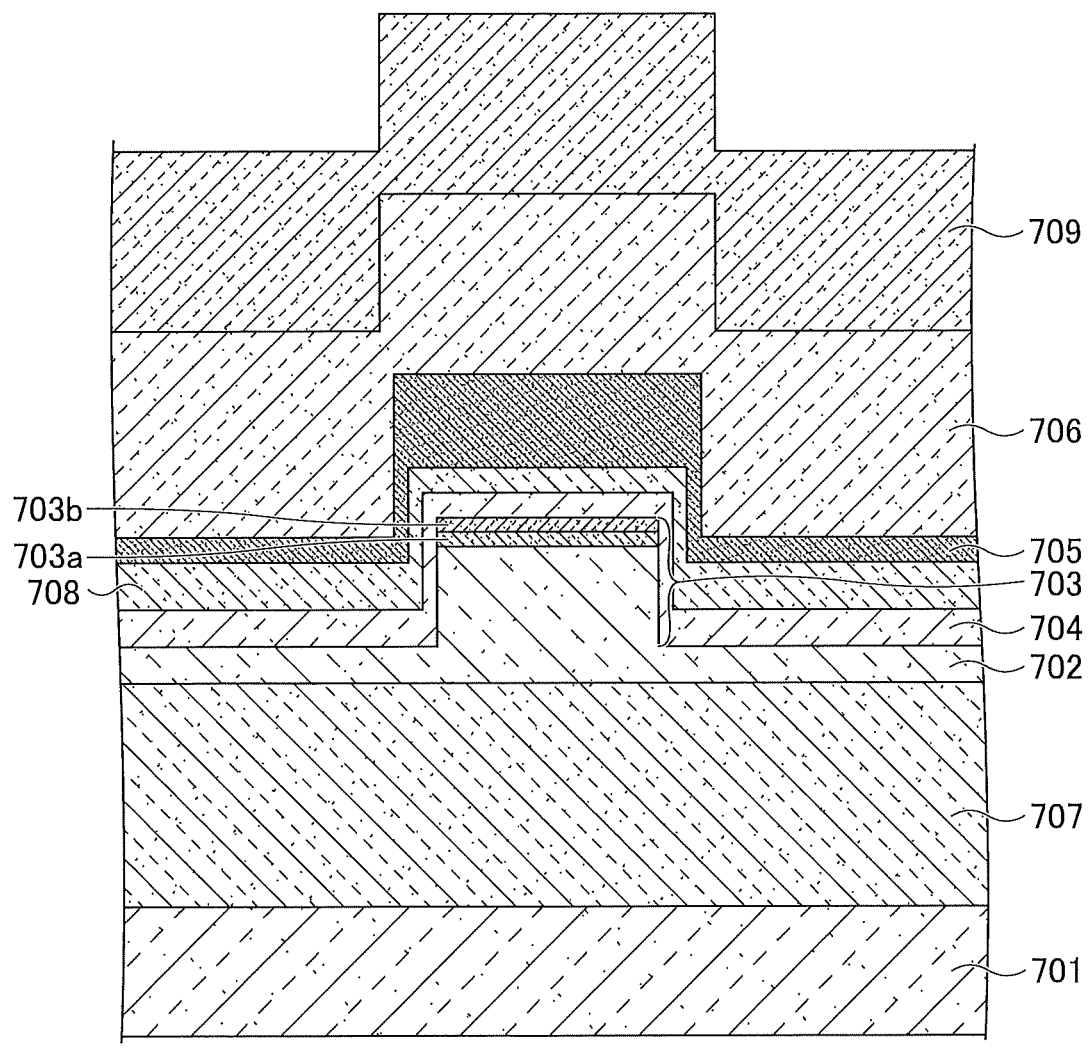
FIG. 15C is a third cross-sectional view illustrating the method of manufacturing the light emitting device according to the seventh embodiment.

Thereafter, as illustrated in FIG. 15C, the p-GaN layer 704, the p-AlGaN layer 708, the multi-quantum wells layer 705, the n-GaN layer 706, and the n-AlGaN layer 709 are made to grow on the n-GaN layer 702 by using an MOCVD apparatus. For example, a growing temperature of the p-GaN layer 704 and the p-AlGaN layer 708 is 1000° C., a thickness of the p-GaN layer 704 is 20 nm on the projecting portion 703, and a thickness of the p-AlGaN layer 708 is 20 nm on the projecting portion 703. For example, the growing temperature of the multi-quantum wells layer 705 is 750° C., and in the growth of the multi-quantum wells layer 705, 3 nm-thick InGaN layers and 7 nm-thick GaN layers are alternately laminated five times. For example, a growing temperature of the n-GaN layer 706 and the n-AlGaN layer 709 is 850° C., a thickness of the n-GaN layer 506 is 120 nm, and a thickness of the n-AlGaN layer 509 is 500 nm. Since a film thickness of the projecting portion is 100 nm, the projection caused by the projecting portion is left to form a ridge structure.

Figure 15D:
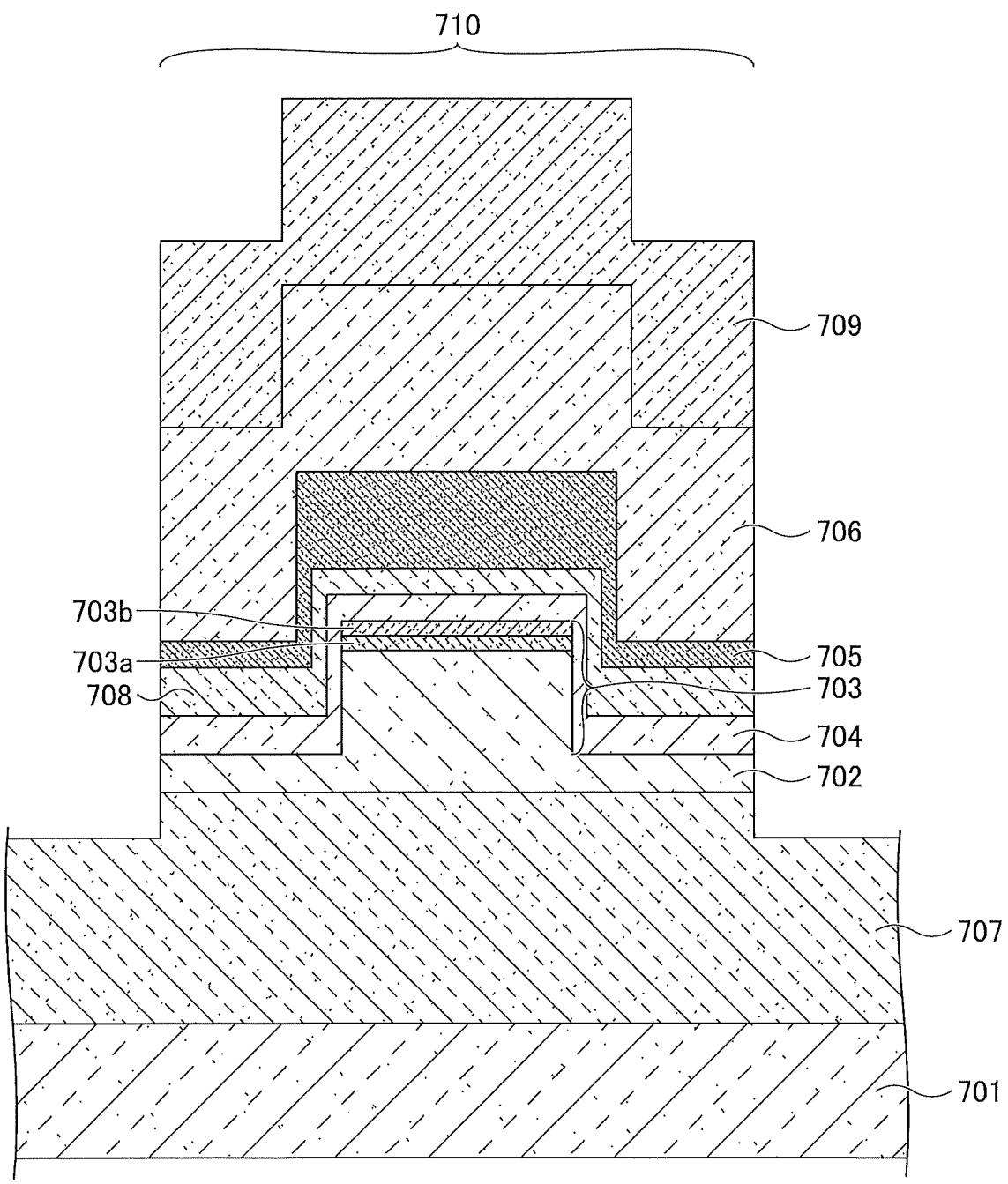
FIG. 15D is a fourth cross-sectional view illustrating the method of manufacturing the light emitting device according to the seventh embodiment.

Next, as illustrated in FIG. 15D, the mesa structure 710 is formed as an element isolation structure. In the formation of the mesa structure 710, the laminated structure (the n-GaN substrate 701 and the like) illustrated in FIG. 15C is taken out of the MOCVD apparatus, and a part of the n-AlGaN layer 709, a part of the n-GaN layer 706, a part of the multi-quantum wells layer 705, a part of the p-AlGaN layer 708, a part of the p-GaN layer 704, a part of the n-GaN layer 702, and a part of the n-AlGaN layer 707 are dry-etched. For example, the mesa structure 710 is rectangular in a plan view having a width of 200 μm. Next, the laminated structure (the n-GaN substrate 701 and the like) illustrated in FIG. 15D is subject to a heat treatment in an oxygen atmosphere to desorb hydrogen contained in the p$^{++}$-InGaN layer 703b, the p-GaN layer 704, and the p-AlGaN layer 708, and to activate Mg.

Thereafter, the anode electrode 711 is formed on the lower surface of the n-GaN substrate 701, and the cathode electrode 712 is formed on the upper surface of the n-AlGaN layer 709 (see FIG. 14). For example, the anode electrode 711 and the cathode electrode 712 include a Ti film and an Al film on the Ti film.

In the light emitting device 700, a refractive index of the n$^{++}$-InGaN layer 703a and the p$^{++}$-InGaN layer 703b forming the tunnel junction layer is higher than a refractive index of the p-GaN layer 704. Therefore, the light-confining structure in the in-plane direction of the substrate 701 can be implemented by the projecting portion 703. Furthermore, in the in-plane direction of the substrate 701, the n-GaN layer 706 having a refractive index lower than that of the multi-quantum wells layer 705 is formed on the sides of the multi-quantum wells layer 705. Therefore, also in this embodiment, the light-confining structure in the in-plane direction of the substrate 701 can be implemented. Therefore, a stronger light-confining effect can be obtained in the edge emitting laser.

Eighth Embodiment

Figure 16:
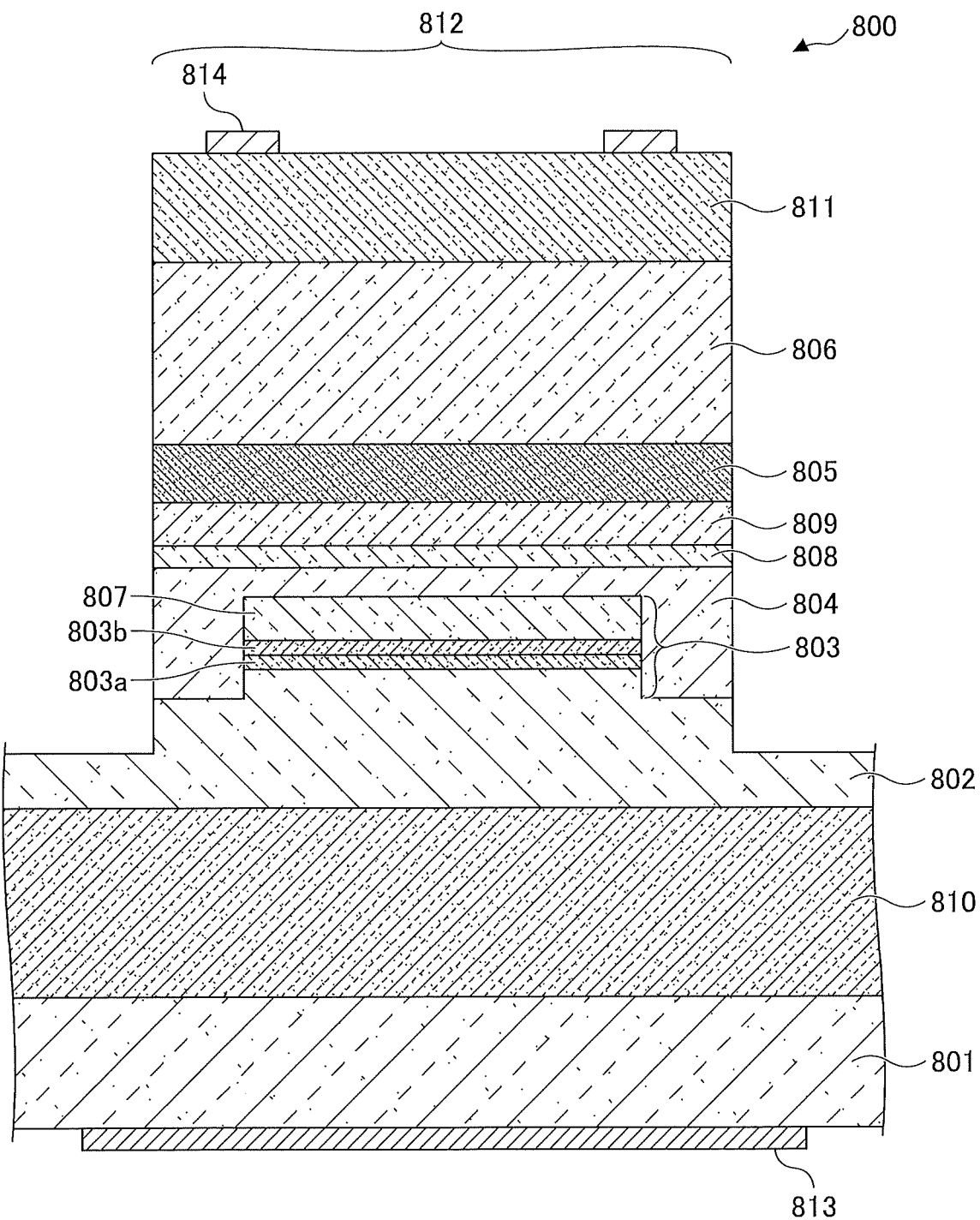
FIG. 16 is a cross-sectional view illustrating a light emitting device according to an eighth embodiment.

Next, an eighth embodiment is described. The eighth embodiment relates to a surface emitting laser as an exemplary light emitting device in which a nitride semiconductor is used. FIG. 16 is a cross-sectional view illustrating a light emitting device according to the eighth embodiment.

A light emitting device 800 according to the eighth embodiment includes: an n-GaN substrate 801; a lower n-type multilayer reflector 810 on the n-GaN substrate 801; an n-GaN layer 802 on the lower n-type multilayer reflector 810; an n$^{++}$-GaN layer 803a on the n-GaN layer 802; a p$^{++}$-GaN layer 803b on the n$^{++}$-GaN layer 803a; and a p-InGaN layer 807 on the p$^{++}$-GaN layer 803b. For example, the p$^{++}$-GaN layer 803b is doped with about $10^{20}$ cm$^{-3}$ of Mg, the n$^{++}$-GaN layer 803a is doped with about $10^{20}$ cm$^{-3}$ of Si or Ge, and the p$^{++}$-GaN layer 803b and the n$^{++}$-GaN layer 803a form a tunnel junction layer. A part of the p-InGaN layer 807, a part of the p$^{++}$-GaN layer 803b, a part of the n$^{++}$-GaN layer 803a, and a part of the n-GaN layer 802 are etched to form a projecting portion 803. That is, the projecting portion 803 includes a part (surface layer portion) of the n-GaN layer 802, a tunnel junction layer, and the p-InGaN layer 807. The projecting portion 803 does not necessarily have to include the n-GaN layer 802, and the projecting portion 803 may be formed of a tunnel junction layer and the p-InGaN layer 807.

The light emitting device 800 further includes: a p-GaN layer 804 on the n-GaN layer 802; a p-AlGaN layer 808 on the p-GaN layer 804; an InGaN layer 809 on the p-AlGaN layer 808; a multi-quantum wells layer 805 on the InGaN layer 809; an n-GaN layer 806 on the multi-quantum wells layer 805; and an upper n-type multilayer reflector 811 on the n-GaN layer 806. For example, the p-GaN layer 804 covers the projecting portion 803 from above and from the sides. The multi-quantum wells layer 805 is an example of an active layer, and includes InGaN layers and GaN layers that are alternately laminated. The p-AlGaN layer 808 functions as an electron block layer and blocks transfer of electrons from the multi-quantum wells layer 805 to the p-GaN layer 804. The InGaN layer 809 functions as an Mg diffusion preventing layer, and prevents diffusion of Mg from the $p^{++}$-GaN layer 803b or the like to the multi-quantum wells layer 805.

The lower n-type multilayer reflector 810 and the upper n-type multilayer reflector 811 have a structure in which, for example, low refractive index layers of an AlN/GaN superlattice structure and high refractive index layers made of InGaN are alternately laminated. An average refractive index of the low refractive index layer is smaller than an average refractive index of the high refractive index layer.

A part of the upper n-type multilayer reflector 811, a part of the n-GaN layer 806, a part of the multi-quantum wells layer 805, a part of the InGaN layer 809, a part of the p-AlGaN layer 808, a part of the p-GaN layer 804, and a part of the n-GaN layer 802 are etched to form a mesa structure 812 as an element isolation structure. An anode electrode 813 is formed on the lower surface of the n-GaN substrate 801. For example, the anode electrode 813 includes a Ti film and an Al film on the Ti film. A cathode electrode 814 is formed on the upper surface of the upper n-type multilayer reflector 811 in an area separated from the projecting portion 803 in a plan view. The cathode electrode 814 includes a Ti film and an Al film on the Ti film.

Next, a method of manufacturing the light emitting device 800 according to the eighth embodiment is described. FIGS. 17A to 17D are cross-sectional views illustrating a method of manufacturing the light emitting device 800 according to the eighth embodiment.

Figure 17A:
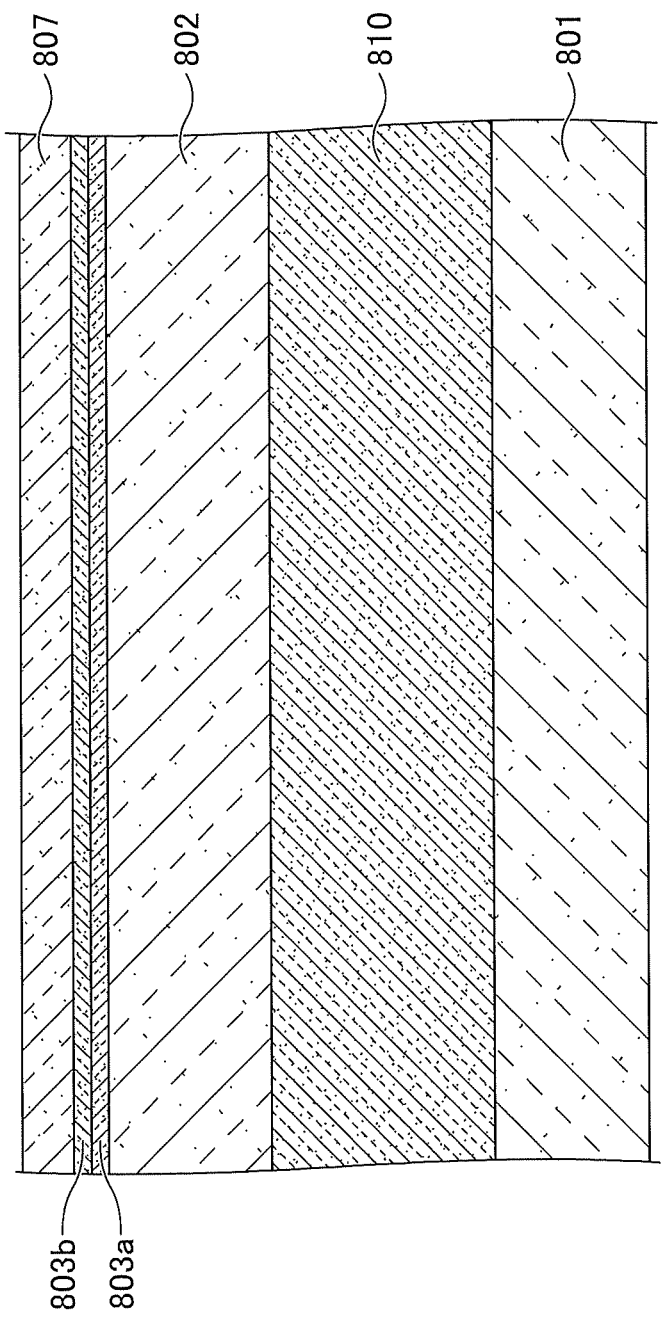
FIG. 17A is a first cross-sectional view illustrating a method of manufacturing the light emitting device according to the eighth embodiment.

First, as illustrated in FIG. 17A, the lower n-type multilayer reflector 810, the n-GaN layer 802, the $n^{++}$-GaN layer 803a, the $p^{++}$-GaN layer 803b, and the p-InGaN layer 807 are made to grow on the n-GaN substrate 801 by using an MOCVD apparatus. A growing temperature of the lower n-type multilayer reflector 810 is set to, for example, 850° C. For example, a growing temperature of the n-GaN layer 802, the $n^{++}$-GaN layer 803a, and the $p^{++}$-GaN layer 803b is 1000° C., a thickness of the n-GaN layer 802 is 105 nm, a thickness of the $n^{++}$-GaN layer 803a is 10 nm, and a thickness of the $p^{++}$-GaN layer 803b is 10 nm. For example, a growing temperature of the p-InGaN layer 807 is 900° C., and a thickness of the p-InGaN layer 807 is 30 nm.

Figure 17B:
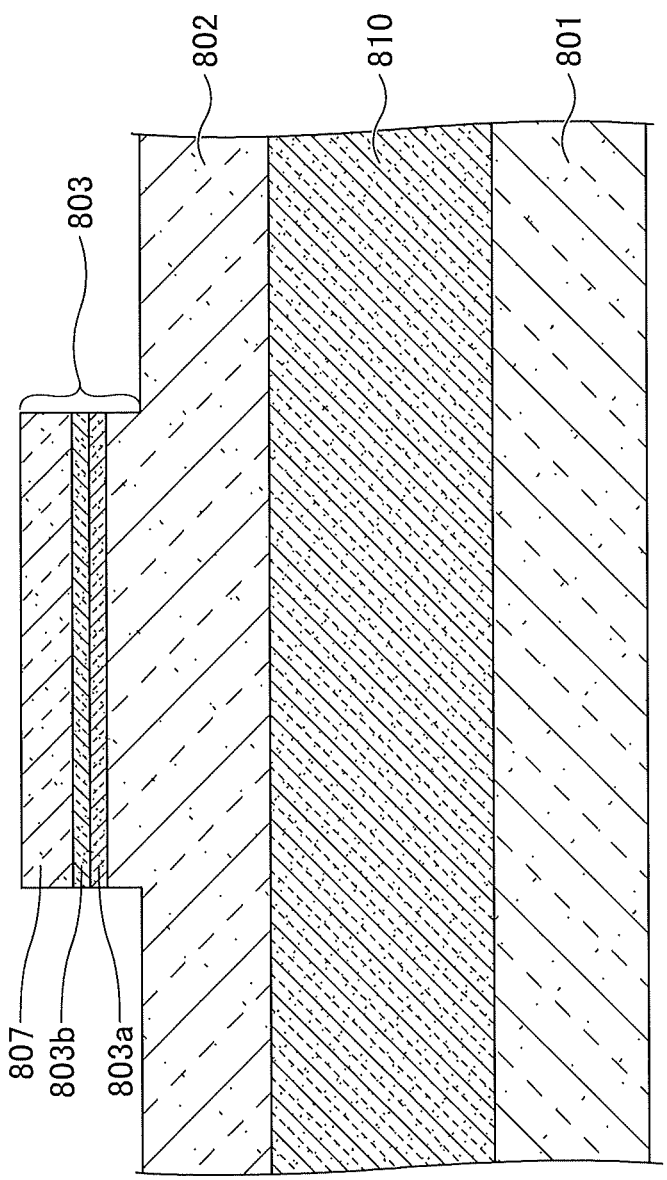
FIG. 17B is a second cross-sectional view illustrating the method of manufacturing the light emitting device according to the eighth embodiment.

Next, as illustrated in FIG. 17B, a projecting portion 803 is formed. In the formation of the projecting portion 803, the laminated structure (the n-GaN substrate 801 and the like) illustrated in FIG. 17A is taken out of the MOCVD apparatus, and a dry etching mask (not illustrated) is formed by photolithography on the p-InGaN layer 807 to cover the light emitting device 800 in an area in which a current flows, that is, an area in which the projecting portion 803 is to be formed. As a dry etching mask, for example, a $SiO_2$ film that is circular in a plan view and has a diameter of 5 μm is formed. Next, the projecting portion 803 is formed by dry-etching the p-InGaN layer 807, the $p^{++}$-GaN layer 803b, the $n^{++}$-GaN layer 803a, and the n-GaN layer 802 by using the dry etching mask. A depth to etch is set to, for example, 70 nm in order to reliably remove the tunnel junction layer in an area in which no current flows. However, the etching may be ended when the etching of the $n^{++}$-GaN layer 803a is completed and the n-GaN layer 802 is exposed. That is, the n-GaN layer 802 does not necessarily have to be etched. After the projecting portion 803 is formed, the dry etching mask is removed.

Figure 17C:
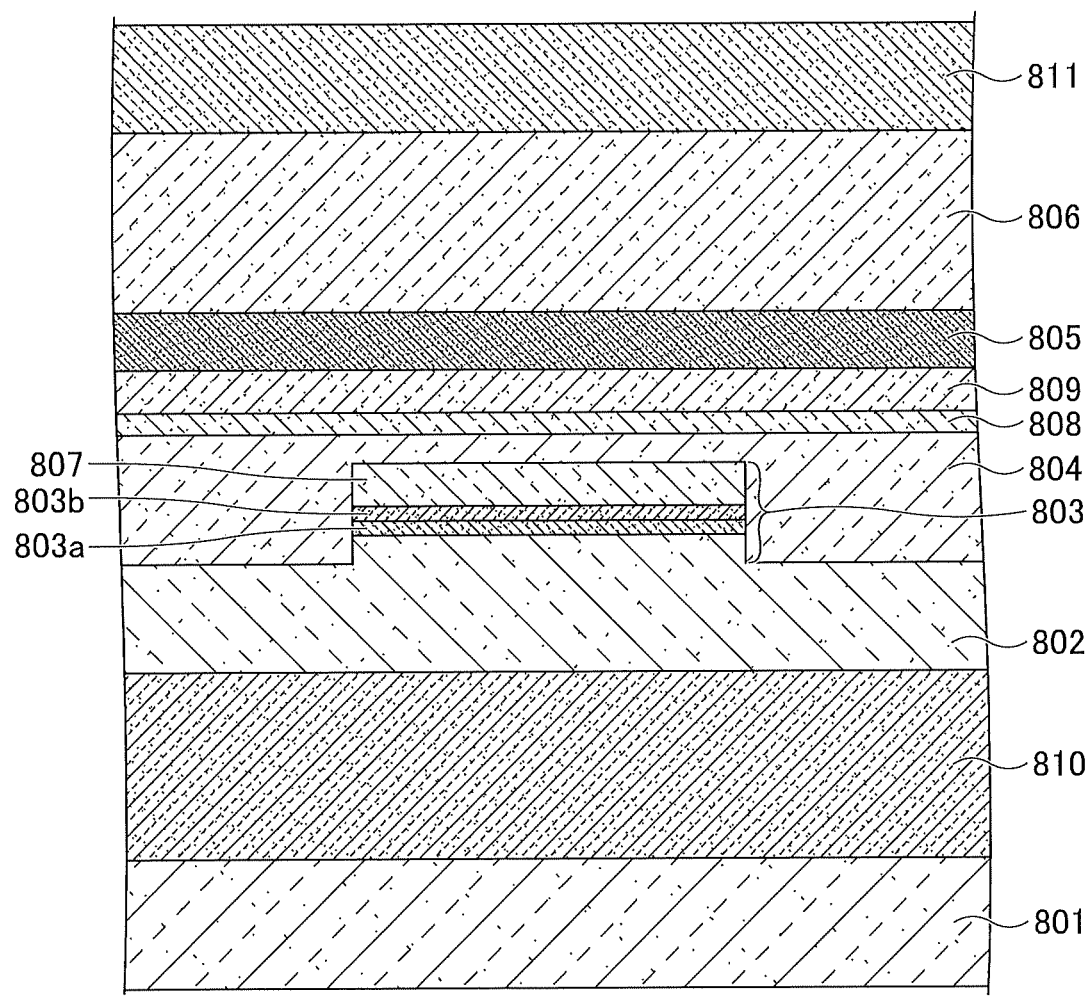
FIG. 17C is a third cross-sectional view illustrating the method of manufacturing the light emitting device according to the eighth embodiment.

Thereafter, as illustrated in FIG. 17C, the p-GaN layer 804, the p-AlGaN layer 808, the InGaN layer 809, the multi-quantum wells layer 805, the n-GaN layer 806, and the upper n-type multilayer reflector 811 are made to grow on the n-GaN layer 802 by using an MOCVD apparatus. For example, a growing temperature of the p-GaN layer 804 and the p-AlGaN layer 808 is 1000° C., a thickness of the p-GaN layer 804 is 20 nm on the projecting portion 803, and a thickness of the p-AlGaN layer 808 is 10 nm. In the formation of the p-GaN layer 804, for example, a supply amount of trimethylgallium, which is a Ga material, is 10 μmol/min, a supply amount of $NH_3$, which is a nitrogen material, is 100 mmol/min, and a V/III ratio is 10000. When the p-GaN layer 804 is formed under such conditions, migration of atoms is accelerated, a projection caused by the projecting portion 803 is eliminated, and the thickness of the p-GaN layer 804 becomes 90 nm on the sides of the projecting portion 803. For example, a growing temperature of the InGaN layer 809 is 750° C., and a thickness of the InGaN layer 809 is 30 nm. For example, a growing temperature of the multi-quantum wells layer 805 is 750° C., and in the growth of the multi-quantum wells layer 805, 6 nm-thick InGaN layers and 4 nm-thick GaN layers are alternately laminated five times. For example, a growing temperature of the n-GaN layer 806 is 850° C., and a thickness of the n-GaN layer 806 is 55 nm. For example, a growing temperature of the upper n-type multilayer reflector 811 is set to 850° C.

Figure 17D:
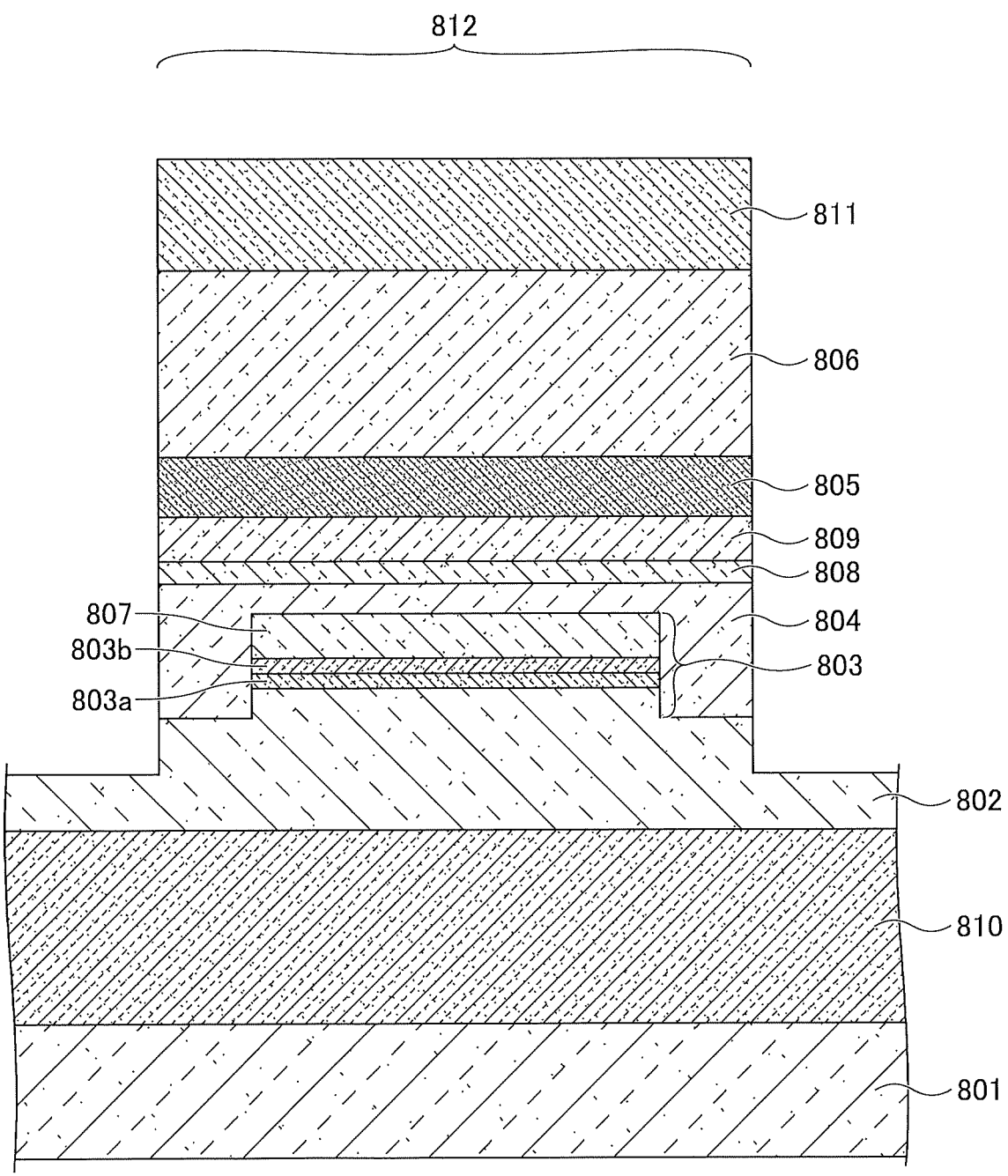
FIG. 17D is a fourth cross-sectional view illustrating the method of manufacturing the light emitting device according to the eighth embodiment.

Next, as illustrated in FIG. 17D, the mesa structure 812 is formed as an element isolation structure. In the formation of the mesa structure 812, the laminated structure (the n-GaN substrate 801 and the like) illustrated in FIG. 17C is taken out of the MOCVD apparatus, and a part of the upper n-type multilayer reflector 811, a part of the n-GaN layer 806, a part of the multi-quantum wells layer 805, a part of the InGaN layer 809, a part of the p-AlGaN layer 808, a part of the p-GaN layer 804, and a part of the n-GaN layer 802 are dry-etched. For example, the mesa structure 812 is circular in a plan view and has a diameter of 30 μm. Next, the laminated structure (the n-GaN substrate 801 and the like) illustrated in FIG. 17D is subject to heat treatment in an oxygen atmosphere to desorb hydrogen contained in the $p^{++}$-GaN layer 803b, the p-InGaN layer 807, the p-GaN layer 804, and the p-AlGaN layer 808, and to activate Mg.

Thereafter, the anode electrode 813 is formed on the lower surface of the n-GaN substrate 801, and the cathode electrode 814 is formed on the upper surface of the upper n-type multilayer reflector 811 in an area separated from the projecting portion 803 in a plan view (see FIG. 16). For example, the anode electrode 813 and the cathode electrode 814 include a Ti film and an Al film on the Ti film.

In this manner, the light emitting device 800 according to the eighth embodiment is manufactured.

In the light emitting device 800, since the projecting portion 803 includes the p-InGaN layer 807 having a refractive index higher than that of the p-GaN layer 804, a light-confining structure in the in-plane direction of the substrate 801 can be implemented by the projecting portion 803. Therefore, a strong light-confining effect can be obtained in the surface emitting laser.

Further, the InGaN layer 809 containing In suppresses mixing of Mg from the $p^{++}$-GaN layer 803*b* or the like to the multi-quantum wells layer 805. Therefore, a decrease in light emission efficiency caused by the mixed Mg can be reduced.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

For example, the shape of the projecting portion in a plan view is not limited to a circle or a rectangle (stripe), and the projecting portion may be formed in an arbitrary shape, such as other polygonal shapes, in a plan view in an area in which a current is to flow.

Further, as the structure of the multilayer reflector, a structure using another nitride semiconductor, such as a combination of AlGaN and GaN, and a combination of AlInN and GaN, may be employed. Further, a structure using a dielectric, such as a combination of $SiO_2$ and SiN, and a combination of $SiO_2$ and $Ta_2O_5$, may be employed. Although the dielectric cannot be energized, a voltage can be applied to a first n-type semiconductor layer and a second n-type semiconductor layer by employing an already proposed electrode structure.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A light emitting device comprising:
   a first n-type semiconductor layer formed on a substrate;
   a tunnel junction layer disposed on a part of the first n-type semiconductor layer;
   a p-type semiconductor layer disposed on the first n-type semiconductor layer and covering the tunnel junction layer;
   an active layer disposed on the p-type semiconductor layer; and
   a second n-type semiconductor layer disposed on the active layer.

2. The light emitting device according to claim 1,
   wherein in a plane parallel to the substrate including the tunnel junction layer,
   a refractive index of the p-type semiconductor layer is smaller than a refractive index of the tunnel junction layer.

3. The light emitting device according to claim 1,
   wherein a distance between the tunnel junction layer and the active layer is 120 nm or shorter.

4. The light emitting device according to claim 1,
   wherein the p-type semiconductor layer includes:
      a first layer contacting the tunnel junction layer and having a first refractive index, and
      a second layer disposed on the first layer and having a second refractive index lower than the first refractive index, and
   an effective refractive index of the p-type semiconductor layer is higher in a first area overlapping the tunnel junction layer in a plan view than in a second area separated from the tunnel junction layer in a plan view.

5. The light emitting device according to claim 1,
   wherein above the tunnel junction layer, the active layer and the second n-type semiconductor layer are located next to each other in a plane parallel to the substrate, the active layer is located between the tunnel junction layer and the second n-type semiconductor layer in a plan view, and
   a refractive index of the active layer is higher than a refractive index of the p-type semiconductor layer and a refractive index of the second n-type semiconductor layer.

6. The light emitting device according to claim 1, further comprising a layer containing In between the active layer and the p-type semiconductor layer.

7. The light emitting device according to claim 1,
   wherein the first n-type semiconductor layer includes a first multilayer reflector, and
   the second n-type semiconductor layer includes a second multilayer reflector.

8. A method of manufacturing a light emitting device, the method comprising:
   forming a first n-type semiconductor layer on a substrate;
   forming a tunnel junction layer on a part of the first n-type semiconductor layer;
   forming, on the first n-type semiconductor layer, a p-type semiconductor layer configured to cover the tunnel junction layer;
   forming an active layer on the p-type semiconductor layer; and
   forming a second n-type semiconductor layer on the active layer.

9. The method of manufacturing a light emitting device according to claim 8, wherein
   in the forming of the p-type semiconductor layer and the forming of the active layer, the p-type semiconductor layer and the active layer are formed leaving a projection shape caused by the tunnel junction layer.

10. The method of manufacturing a light emitting device according to claim 8, wherein a temperature in forming the p-type semiconductor layer is higher by 100° C. or more than a temperature in forming the active layer.

* * * * *